(12) United States Patent
Yeh

(10) Patent No.: US 11,037,878 B1
(45) Date of Patent: Jun. 15, 2021

(54) SEMICONDUCTOR DEVICE WITH EMI PROTECTION LINERS AND METHOD FOR FABRICATING THE SAME

(71) Applicant: NANYA TECHNOLOGY CORPORATION, New Taipei (TW)

(72) Inventor: Huan-Yung Yeh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/850,486

(22) Filed: Apr. 16, 2020

(51) Int. Cl.
| | |
|---|---|
| *H01L 23/538* | (2006.01) |
| *H01L 25/065* | (2006.01) |
| *H01L 21/48* | (2006.01) |
| *H01L 23/00* | (2006.01) |
| *H01L 25/00* | (2006.01) |

(52) U.S. Cl.
CPC ...... *H01L 23/5384* (2013.01); *H01L 21/4853* (2013.01); *H01L 24/13* (2013.01); *H01L 25/0657* (2013.01); *H01L 25/50* (2013.01)

(58) Field of Classification Search
CPC . H01L 25/0657; H01L 23/5384; H01L 24/16; H01L 24/13; H01L 25/50; H01L 2225/06541
See application file for complete search history.

(56) References Cited

U.S. PATENT DOCUMENTS

| | | | |
|---|---|---|---|
| 8,674,510 B2 * | 3/2014 | Law | H01L 25/0657 257/773 |
| 2011/0050320 A1 * | 3/2011 | Gillingham | H01L 23/481 327/365 |
| 2013/0234326 A1 * | 9/2013 | Kim | H01L 23/562 257/738 |

* cited by examiner

*Primary Examiner* — Jasmine J Clark
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a plurality of semiconductor memory dies vertically stacked through a plurality of microbumps; a plurality of through silicon vias positioned in the plurality of semiconductor dies and electrically coupled through the plurality of microbumps; and a plurality of protection liners positioned on sides of the plurality of through silicon vias; wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

20 Claims, 20 Drawing Sheets

SEMICONDUCTOR DEVICE WITH EMI PROTECTION LINERS AND METHOD FOR FABRICATING THE SAME

TECHNICAL FIELD

The present disclosure relates to a semiconductor device and a method for fabricating the semiconductor device, and more particularly, to a semiconductor device with an electromagnetic interference protection liner and a method for fabricating the semiconductor device with the electromagnetic interference protection liner.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device comprises a plurality of semiconductor memory dies vertically stacked through a plurality of microbumps; a plurality of through silicon vias positioned in the plurality of semiconductor dies and electrically coupled through the plurality of microbumps; and a plurality of protection liners positioned on sides of the plurality of through silicon vias; wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

In some embodiments, the plurality of semiconductor dies are memories.

In some embodiments, one of the plurality of through silicon vias is electrically coupled to a supply voltage and another one of the plurality of through silicon vias is electrically coupled to a ground potential.

In some embodiments, the semiconductor device further comprises an interposer, wherein the plurality of semiconductor memory dies are disposed on the interposer, and the plurality of through silicon vias are electrically connected to bond pads of the interposer.

In some embodiments, the semiconductor device further comprises a connection structure comprising a connection dielectric layer, a first conductive plate positioned in the connection dielectric layer and electrically coupled to a supply voltage, a first bottom protection layer positioned below the first conductive plate, and a first top protection layer positioned on the first conductive plate; and a connection conductive layer positioned in the connection dielectric layer; wherein the first bottom protection layer and the first top protection layer are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

In some embodiments, the semiconductor device further comprises a second conductive plate positioned in the connection dielectric layer and electrically coupled to a ground potential, a second bottom protection layer positioned below the second conductive plate, and a second top protection layer positioned on the second conductive plate, wherein the second bottom protection layer and the second top protection layer are formed of same materials as the first bottom protection layer.

In some embodiments, the semiconductor device further comprises a first redistribution structure positioned below the connection structure, a second redistribution structure positioned on the connection structure, a first semiconductor die positioned below the first redistribution structure, and a second semiconductor die positioned on the second redistribution structure.

In some embodiments, the first redistribution structure comprises a first redistribution dielectric layer positioned below the connection dielectric layer and a first redistribution conductive layer positioned in the first redistribution dielectric layer, the second redistribution structure comprises a second redistribution dielectric layer positioned on the connection dielectric layer and a second redistribution conductive layer positioned in the second redistribution dielectric layer, the first conductive plate is electrically coupled to the second redistribution conductive layer, the second conductive plate is electrically coupled to the first redistribution conductive layer, and the connection conductive layer is electrically coupled to the first redistribution conductive layer and the second redistribution conductive layer.

In some embodiments, the semiconductor device further comprises a connection supporting layer positioned in the connection dielectric layer, wherein a thickness of the connection supporting layer is less than a thickness of the connection conductive layer.

In some embodiments, the semiconductor device further comprises a barrier layer positioned on sides of the connection conductive layer and a bottom surface of the connection conductive layer, wherein the barrier layer is formed of titanium nitride, tantalum nitride, titanium, tantalum, or titanium tungsten.

In some embodiments, the semiconductor device further comprises a alleviation layer positioned in the connection dielectric layer, wherein the alleviation layer is porous.

In some embodiments, the semiconductor device further comprises a first magnetic layer positioned above the first top protection layer and a second magnetic layer positioned below the second bottom protection layer, wherein the first conductive plate is positioned above the second conductive plate and one of the first magnetic layer or the second magnetic layer is permanently magnetized.

In some embodiments, a distance between the first magnetic layer and the first top protection layer is equal to a distance between the second bottom protection layer and the second magnetic layer.

In some embodiments, a width of the first magnetic layer is greater than a width of the first top protection layer.

Another aspect of the present disclosure provides a method for fabricating a semiconductor device, comprising: preparing a plurality of semiconductor memory dies with a plurality of via holes penetrating the semiconductor memory dies; forming a plurality of protection liners on sides of the plurality of via holes; forming a plurality of through silicon vias in the plurality of via holes, wherein the plurality of protection liners surrounds the plurality of through silicon vias; and vertically stacking the plurality of semiconductor memory dies through a plurality of microbumps to form a memory stack, wherein the plurality of microbumps electrically connects the plurality of through silicon vias of two adjacent semiconductor memory dies; wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

In some embodiments, the method for fabricating the semiconductor device further comprises: forming an interposer having a plurality of first bond pads on a first side and a plurality of second bond pads on a second side; and attaching the memory stack to a first site of the interposer.

In some embodiments, the method for fabricating the semiconductor device further comprises: a step of attaching a processor die to a second site of the interposer, wherein the first site and the second site are on the first side of the interposer.

In some embodiments, the method for fabricating the semiconductor device further comprises: a step of attaching a package substrate on a second side of the interposer.

In some embodiments, the forming of the interposer comprises: forming a connection structure comprising a connection dielectric layer, a first conductive plate in the connection dielectric layer and electrically coupled to a supply voltage, a first bottom protection layer below the first conductive plate, and a first top protection layer on the first conductive plate; and forming a connection conductive layer in the connection dielectric layer; wherein the first bottom protection layer and the first top protection layer are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

In some embodiments, the forming of the interposer further comprises: forming a second conductive plate in the connection dielectric layer and electrically coupled to a ground potential, a second bottom protection layer below the second conductive plate, and a second top protection layer on the second conductive plate, wherein the second bottom protection layer and the second top protection layer are formed of same materials as the first bottom protection layer.

Due to the design of the semiconductor device of the present disclosure, the electromagnetic interference may be reduced by the plurality of protection layers. Therefore, the performance of the semiconductor device may be improved. In addition, the presence of the alleviation layer may alleviate the parasitic capacitance of the semiconductor device.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
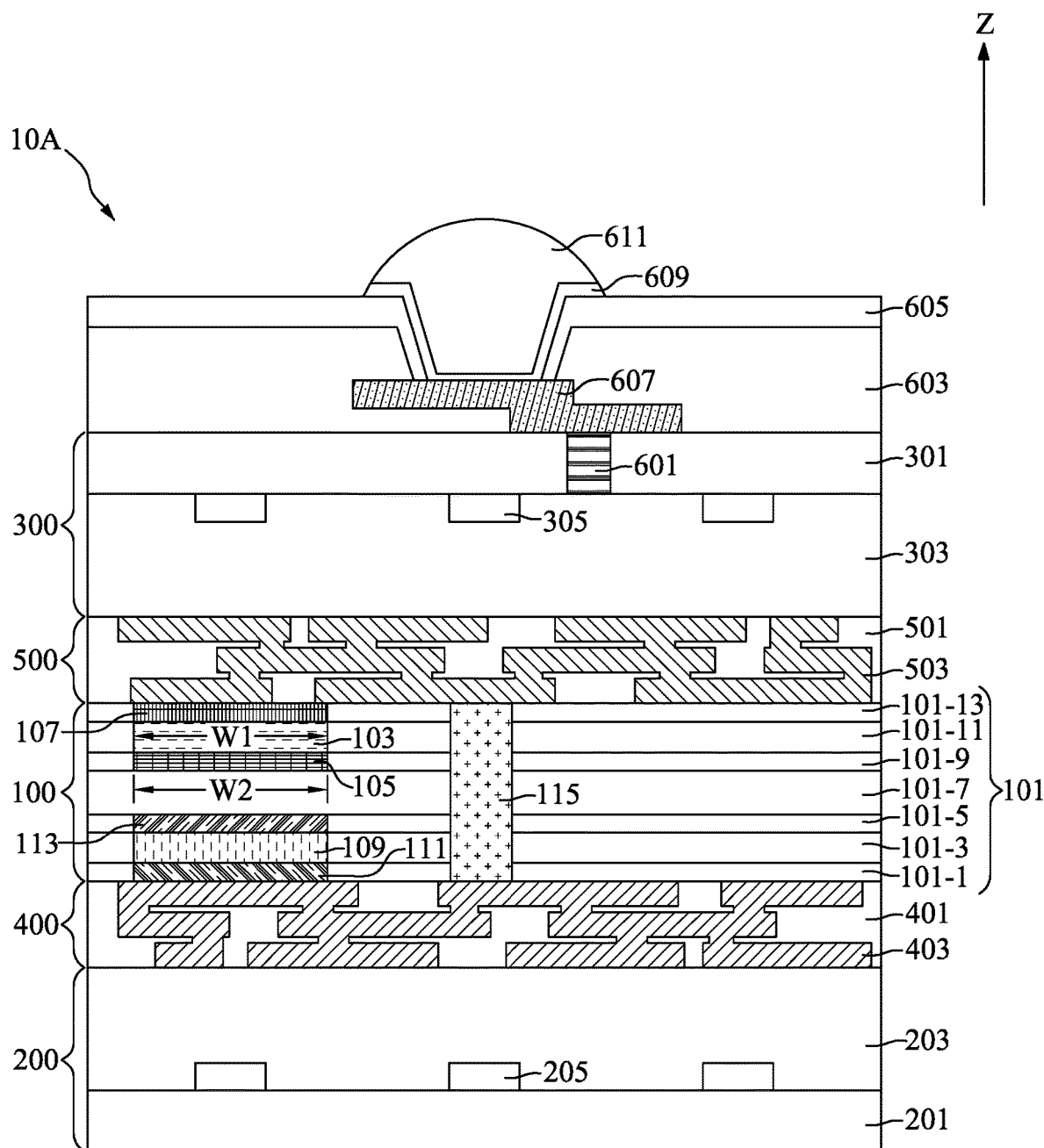
FIG. 1 illustrates, in a schematic cross-sectional diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

FIG. 1 illustrates, in a schematic cross-sectional diagram, a semiconductor device 10A in accordance with one embodiment of the present disclosure.

With reference to FIG. 1, the semiconductor device 10A may include a connection structure 100, a first semiconductor die 200, a second semiconductor die 300, a first redistribution structure 400, a second redistribution structure 500, a through substrate via 601, a first passivation layer 603, a second passivation layer 605, a third redistribution conductive layer 607, a under bump metallization layer 609, and a conductive bump 611.

With reference to FIG. 1, the connection structure 100 may include a connection dielectric layer 101, a first conductive plate 103, a first bottom protection layer 105, a first top protection layer 107, a second conductive plate 109, a second bottom protection layer 111, a second top protection layer 113, and a connection conductive layer 115.

With reference to FIG. 1, the connection dielectric layer 101 may be a stacked layer structure. The connection dielectric layer 101 may include a plurality of sub-layers 101-1, 101-3, 101-5, 101-7, 101-9, 101-11, 101-13. Each of the plurality of sub-layers 101-1, 101-3, 101-5, 101-7, 101-9, 101-11, 101-13 may have a thickness between about 0.5 micrometer and about 3.0 micrometer. The plurality of sub-layers 101-1, 101-3, 101-5, 101-7, 101-9, 101-11, 101-13 may be formed of, for example, silicon oxide, borophosphosilicate glass, undoped silicate glass, fluorinated silicate glass, low-k dielectric materials, the like, or a combination thereof. The plurality of sub-layers 101-1, 101-3, 101-5, 101-7, 101-9, 101-11, 101-13 may be formed of different materials but are not limited thereto. The low-k dielectric materials may have a dielectric constant less than 3.0 or even less than 2.5. In some embodiments, the low-k dielectric materials may have a dielectric constant less than 2.0. In some embodiments, the plurality of sub-layers 101-1, 101-5, 101-9, 101-13 may be etch stop layer and may be formed of, for example, carbon-doped oxide, carbon incorporated silicon oxide, ornithine decarboxylase, or nitrogen-doped silicon carbide.

With reference to FIG. 1, the first conductive plate 103 may be disposed in the connection dielectric layer 101; specifically, the first conductive plate 103 may be disposed in the sub-layer 101-11. The first conductive plate 103 may be formed of, for example, copper, aluminum, titanium, the like, or a combination thereof. The first conductive plate 103 may be electrically coupled to a supply voltage and may be regarded as part of a VDD trace.

With reference to FIG. 1, the first bottom protection layer 105 may be disposed in the connection dielectric layer 101 and below the first conductive plate 103; specifically, the first bottom protection layer 105 may be disposed in the sub-layer 101-9 and below the first conductive plate 103. The first top protection layer 107 may be disposed in the connection dielectric layer 101 and on the first conductive plate 103; specifically, the first top protection layer 107 may be disposed in the sub-layer 101-13 and on the first conductive plate 103. The first bottom protection layer 105 and the first top protection layer 107 may be formed of, for example, manganese-zinc ferrite, nickel-zinc ferrite, cobalt ferrite, strontium ferrite, barium ferrite, lithium ferrite, lithium-zinc ferrite, single crystal yttrium iron garnet, gallium substituted single crystal yttrium iron garnet, or the like. The first bottom protection layer 105 and the first top protection layer 107 may be formed of a same material but are not limited thereto.

In some embodiments, a width W1 (or dimension) of the first conductive plate 103 may be equal to or less than a width W2 (or dimension) of the first bottom protection layer 105 (or the first top protection layer 107). The first conductive plate 103 may be electrically coupled to other conductive features by forming a conductive via (not shown in FIG. 1) in the first bottom protection layer 105 (or the first top protection layer 107) and below (or on) the first conductive plate 103. In some embodiments, the width W1 (or dimension) of the first conductive plate 103 may be greater than the width W2 (or dimension) of the first bottom protection layer 105 (or the first top protection layer 107). The first conductive plate 103 may be electrically coupled to other conductive features by forming a conductive via (not shown in FIG. 1) on (or below) the first conductive plate 103. In some embodiments, the conductive via may be formed adjacent to the first bottom protection layer 105 (or the first top protection layer 107).

With reference to FIG. 1, the second conductive plate 109 may be disposed in the connection dielectric layer 101; specifically, the second conductive plate 109 may be disposed in the sub-layer 101-3 and below the first conductive plate 103. In some embodiments, the second conductive plate 109 may be disposed above the first conductive plate 103. In some embodiments, the second conductive plate 109 may be offset form the first conductive plate 103. In some embodiments, the second conductive plate 109 may have a same width (or dimension) as the first conductive plate 103. In some embodiments, the second conductive plate 109 may have a similar width (or dimension) with the first conductive plate 103. The second conductive plate 109 may be formed of a same material as the first conductive plate 103 but is not limited thereto. The second conductive plate 109 may be electrically coupled to a ground potential and may be regarded as part of a $V_{SS}$ trace.

With reference to FIG. 1, the second bottom protection layer 111 may be disposed in the connection dielectric layer 101 and below the second conductive plate 109; specifically, the second bottom protection layer 111 may be disposed in the sub-layer 101-1 and below the second conductive plate 109. The second top protection layer 113 may be disposed in the connection dielectric layer 101 and on the second conductive plate 109; specifically, the second top protection layer 113 may be disposed in the sub-layer 101-5 and on the second conductive plate 109. The second bottom protection layer 111 and the second top protection layer 113 may be formed of same materials as the first bottom protection layer 105. The second bottom protection layer 111 and the second top protection layer 113 may be formed of a same material but are not limited thereto.

In some embodiments, the second bottom protection layer 111 (or the second top protection layer 113) may have a same width (or dimension) as the first bottom protection layer 105. In some embodiments, the second bottom protection layer 111 (or the second top protection layer 113) may have a similar width (or dimension) with the first bottom protection layer 105. In some embodiments, the second conductive plate 109 may be electrically coupled to other conductive features by forming a conductive via (not shown in FIG. 1) in the second bottom protection layer 111 (or the second top protection layer 113) and below (or on) the second conductive plate 109. In some embodiments, the second conductive plate 109 may be electrically coupled to other conductive features by forming a conductive via (not shown in FIG. 1) on (or below) the second conductive plate 109. In some embodiments, the conductive via may be formed adjacent to the second bottom protection layer 111 (or the second top protection layer 113).

The impedance of the first bottom protection layer 105, the first top protection layer 107, the second bottom protection layer 111, the second top protection layer 113 formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet may be frequency sensitive. For convenience of description, only the first bottom protection layer 105 is described. The direct and low frequency currents, which may see only in conductive features such as the first conductive plate 103 or the second conductive plate 109, are unimpeded by the first bottom protection layer 105. As a comparison, the high frequency energy, which may be the main composition of electromagnetic interference (or radio-frequency interference), may couple with the first bottom protection layer 105 and the impedance of the first bottom protection layer 105 may be developed. The impedance of the first bottom protection layer 105 may dissipate the high frequency energy; therefore, the electromagnetic interference may be reduced.

The first bottom protection layer 105, the first top protection layer 107, the second bottom protection layer 111, and the second top protection layer 113 may serve as attenuators or suppressors of unwanted signals in electrical circuits. In the presence of the first bottom protection layer 105 and the first top protection layer 107, signal transmitted in the first conductive plate 103 may be isolated from electromagnetic interference. In addition, with the assistance of the second bottom protection layer 111 and the second top protection layer 113, unwanted signal transmitted in the second conductive plate 109 may be diminished. As a result, the performance of the semiconductor device 10A including the connection structure 100 may be improved.

With reference to FIG. 1, the connection conductive layer 115 may be disposed in the connection dielectric layer 101. In some embodiments, the top surface of the connection conductive layer 115 may be substantially coplanar with the top surface of the connection dielectric layer 101 (i.e., the top surface of the sub-layer 101-13). The bottom surface of the connection conductive layer 115 may be substantially coplanar with the bottom surface of the connection dielectric layer 101 (i.e., the bottom surface of the sub-layer 101-1). In some embodiments, the connection conductive layer 115 may be disposed penetrating the plurality of sub-layers 101-1, 101-3, 101-5, 101-7, 101-9, 101-11, 101-13. The connection conductive layer 115 may be formed of a same material as the first conductive plate 103 but is not limited thereto. In some embodiments, the connection conductive layer 115 may be electrically coupled to the first conductive plate 103. In some embodiments, the connection conductive layer 115 may be electrically coupled to the second conductive plate 109.

With reference to FIG. 1, the first redistribution structure 400 may be disposed below the connection structure 100; specifically, the first redistribution structure 400 may be disposed below the sub-layer 101-1. The first redistribution structure 400 may include a first redistribution dielectric layer 401 and a first redistribution conductive layer 403. The first redistribution dielectric layer 401 may be disposed below the sub-layer 101-1. The first redistribution dielectric layer 401 may be formed of, for example, polyimide, silicon nitride, silicon oxide, silicon oxynitride, or silicon nitride oxide. The first redistribution conductive layer 403 may be disposed in the first redistribution dielectric layer 401. The first redistribution conductive layer 403 may be formed of, for example, aluminum, copper, tungsten, titanium, titanium nitride, or the like. In some embodiments, the first redistribution conductive layer 403 may be electrically coupled to the connection conductive layer 115. In some embodiments, the first redistribution conductive layer 403 may be electrically coupled to the first conductive plate 103. In some embodiments, the first redistribution conductive layer 403 may be electrically coupled to the second conductive plate 109. In some embodiments, the first redistribution conductive layer 403 may contact the second bottom protection layer 111. In some embodiments, an insulting layer may be disposed between the first redistribution conductive layer 403 and the second bottom protection layer 111. In some embodiments, the first redistribution structure 400 may be optional; in other words, the connection structure 100 may be directly disposed on the first semiconductor die 200 as will be illustrated later.

With reference to FIG. 1, the second redistribution structure 500 may have a similar structure with the first redistribution structure 400 and may be disposed on the connection structure 100. Specifically, the second redistribution structure 500 may be disposed on the sub-layer 101-13. The second redistribution structure 500 may include a second redistribution dielectric layer 501 and a second redistribution conductive layer 503. The second redistribution dielectric layer 501 may be disposed on the sub-layer 101-13. The second redistribution dielectric layer 501 may be formed of a same material as the first redistribution dielectric layer 401 but is not limited thereto. The second redistribution conductive layer 503 may be disposed in the second redistribution dielectric layer 501. The second redistribution conductive layer 503 may be formed of a same material as the first redistribution conductive layer 403 but is not limited thereto. In some embodiments, the second redistribution conductive layer 503 may be electrically coupled to the connection conductive layer 115. In some embodiments, the second redistribution conductive layer 503 may be electrically coupled to the first conductive plate 103. In some embodiments, the second redistribution conductive layer 503 may be electrically coupled to the second conductive plate 109. In some embodiments, the second redistribution conductive layer 503 may contact the first top protection layer 107. In some embodiments, an insulting layer may be disposed between the second redistribution conductive layer 503 and the first top protection layer 107. In some embodiments, the second redistribution structure 500 may be optional; in other words, the connection structure 100 may be directly disposed below the second semiconductor die 300 as will be illustrated later.

With reference to FIG. 1, the first semiconductor die 200 may be disposed below the first redistribution structure 400. The first semiconductor die 200 may include a first substrate 201, a first dielectric layer 203, a plurality of first device elements 205, and a plurality of first conductive features (not shown in FIG. 1 for clarity).

With reference to FIG. 1, the first substrate 201 may be disposed below the first redistribution structure 400. The first substrate 201 may be formed of, for example, silicon, silicon carbide, germanium silicon germanium, gallium arsenic, or indium arsenide.

With reference to FIG. 1, the first dielectric layer 203 may be disposed between the first substrate 201 and the first redistribution dielectric layer 401. In some embodiments, the first dielectric layer 203 may be a stacked layer structure. The first dielectric layer 203 may include a plurality of first insulating sub-layers. The plurality of first insulating sub-layers may be formed of same materials as the sub-layer 101-1 but are not limited thereto.

With reference to FIG. 1, the plurality of first device elements 205 may be disposed in a lower portion of the first dielectric layer 203. The plurality of first device elements 205 may be disposed on the first substrate 201. The plurality of first device elements 205 may be, for example, bipolar junction transistors, metal-oxide-semiconductor field effect transistors, diodes, system large-scale integration, flash memories, dynamic random-access memories, static random-access memories, electrically erasable programmable read-only memories, image sensors, micro-electro-mechanical system, active devices, or passive devices.

The plurality of first conductive features may be disposed in the first dielectric layer 203. The plurality of first conductive features may include, for example, a plurality of first conductive lines, a plurality of first conductive vias, and a plurality of first conductive contacts. The first conductive via may connect adjacent conductive lines along the direction Z. The first conductive via may improve heat dissipation in the first semiconductor die 200 and provide structure support in the first semiconductor die 200. In some embodiments, the plurality of first device elements 205 may be interconnected through the plurality of first conductive features. In some embodiments, the plurality of first device elements 205 may be electrically coupled to the first redistribution conductive layer 403 through the plurality of first conductive features. The plurality of first conductive features may be formed of, for example, copper, aluminum, titanium, the like, or a combination thereof. The plurality of first conductive features may be formed of different materials but are limited thereto.

With reference to FIG. 1, the second semiconductor die 300 may be disposed on the second redistribution structure 500. In some embodiments, the second semiconductor die 300 may have a similar structure with the first semiconductor die 200 but may be positioned in an upside-down manner. The second semiconductor die 300 may include a second substrate 301, a second dielectric layer 303, a plurality of second device elements 305, and a plurality of second conductive features (not shown in FIG. 1 for clarity). The second substrate 301 may be disposed above the second redistribution structure 500. The second substrate 301 may have a similar structure with the first substrate 201. The second substrate 301 may be formed of a same material as the first substrate 201 but is not limited thereto. The second dielectric layer 303 may be disposed between the second substrate 301 and the second redistribution dielectric layer 501. The second dielectric layer 303 may have a similar structure with the first dielectric layer 203. The second dielectric layer 303 may be formed of a same material as the first dielectric layer 203 but is not limited thereto. The plurality of second device elements 305 may have similar structure with the plurality of first device elements 205 but is not limited thereto. The plurality of second conductive features may be disposed in the second dielectric layer 303 and maybe electrically coupled to the plurality of second device elements 305 and the second redistribution conductive layer 503.

The first semiconductor die 200 and the second semiconductor die 300 may provide different functionalities. For example, the first semiconductor die 200 may provide a logic function and the second semiconductor die 300 may provide a memory function. In some embodiments, the first semiconductor die 200 and the second semiconductor die 300 may provide the same functionality.

With reference to FIG. 1, the through substrate via 601 may be disposed in the second substrate 301 and electrically coupled to the plurality of second conductive features. The through substrate via 601 may be formed of, for example, copper, aluminum, titanium, the like, or a combination thereof.

With reference to FIG. 1, the first passivation layer 603 may be disposed on the second substrate 301. The second passivation layer 605 may be disposed on the first passivation layer 603. The third redistribution conductive layer 607 may be disposed in the first passivation layer 603. A portion of the first passivation layer 603 and a portion of the second passivation layer 605 may be recessed to expose a portion of a top surface of the third redistribution conductive layer 607. The first passivation layer 603 and the second passivation layer 605 may be formed of, for example, silicon nitride, silicon oxynitride, silicon oxide nitride, polyimide, polybenzoxazole, or a combination thereof. The first passivation layer 603 and the second passivation layer 605 may be formed of different materials but are not limited thereto. The third redistribution conductive layer 607 may be electrically coupled to the through substrate via 601. The third redistribution conductive layer 607 may be formed of, for example, tungsten, titanium, tin, nickel, copper, gold, aluminum, platinum, cobalt, or a combination thereof.

With reference to FIG. 1, the under bump metallization layer 609 may be disposed on the second passivation layer 605 and the portion of the top surface of the third redistribution conductive layer 607. The conductive bump 611 may be disposed on the under bump metallization layer 609 and electrically coupled to the third redistribution conductive layer 607. The under bump metallization layer 609 may be formed of, for example, chromium, tungsten, titanium, copper, nickel, aluminum, palladium, gold, vanadium, or a combination thereof. The conductive bump 611 may be a solder bump.

The under bump metallization layer 609 may be a single layer structure or a stacked structure of multiple layers. For example, the under bump metallization layer 609 may include a first metal layer, a second metal layer, and a third metal layer stacked sequentially. The first metal layer may serve as an adhesive layer for stably attaching the conductive bump 611 to the third redistribution conductive layer 607 and the second passivation layer 605. For example, the first metal layer may include at least one of titanium, titanium-tungsten, chromium, and aluminum. The second metal layer may serve as a barrier layer for preventing a conductive material contained in the conductive bump 611 from diffusing into the third redistribution conductive layer 607 or the under bump metallization layer 609. The second metal layer may include at least one of copper, nickel, chromium-copper, and nickel-vanadium. The third metal layer may serve as a seed layer for forming the conductive bump 611 or as a wetting layer for improving wetting characteristics of the conductive bump 611. The third metal layer may include at least one of nickel, copper, and aluminum.

FIGS. 2 to 6 illustrate, in schematic cross-sectional diagrams, parts of semiconductor devices 10B, 10C, 10D, 10E, and 10F in accordance with embodiments of the present disclosure. In some embodiments, the semiconductor devices 10B, 10C, 10D, 10E, and 10F are interposers.

Figure 2:
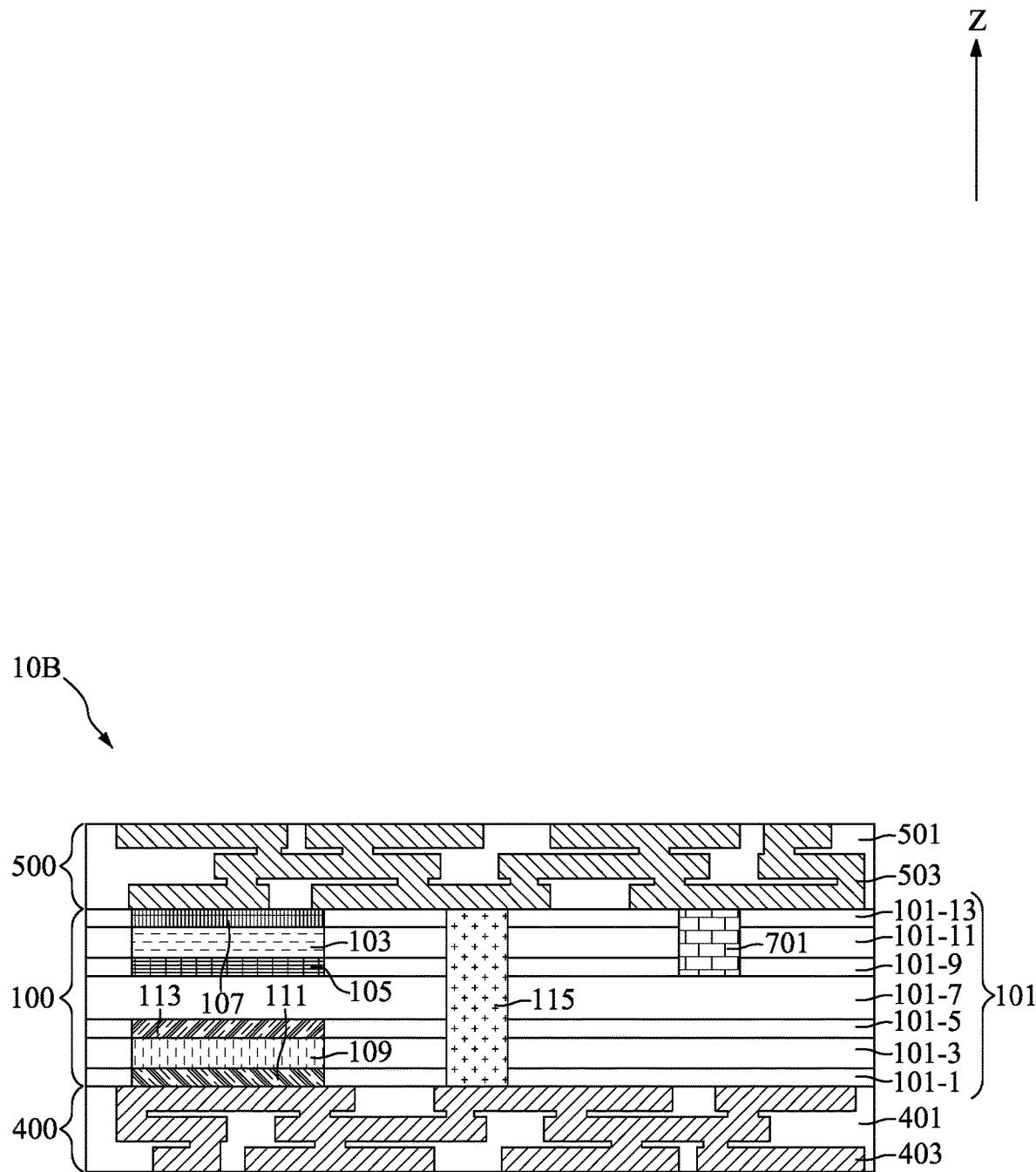
FIGS. 2 to 6 illustrate, in schematic cross-sectional diagrams, parts of semiconductor devices in accordance with embodiments of the present disclosure.

With reference to FIG. 2, in the semiconductor device 10B, a connection supporting layer 701 may be disposed in the connection dielectric layer 101. A thickness of the connection supporting layer 701 may be less than a thickness of the connection conductive layer 115. The connection supporting layer 701 may be formed of a same material as the connection conductive layer 115 but is not limited thereto. In some embodiments, the top surface of the connection supporting layer 701 may be substantially coplanar with the top surface of the connection dielectric layer 101. In some embodiments, the bottom surface of the connection supporting layer 701 may be substantially coplanar with the bottom surface of the connection dielectric layer 101. The connection supporting layer 701 may facilitate a bonding process between the connection structure 100 and the second redistribution structure 500.

Figure 3:
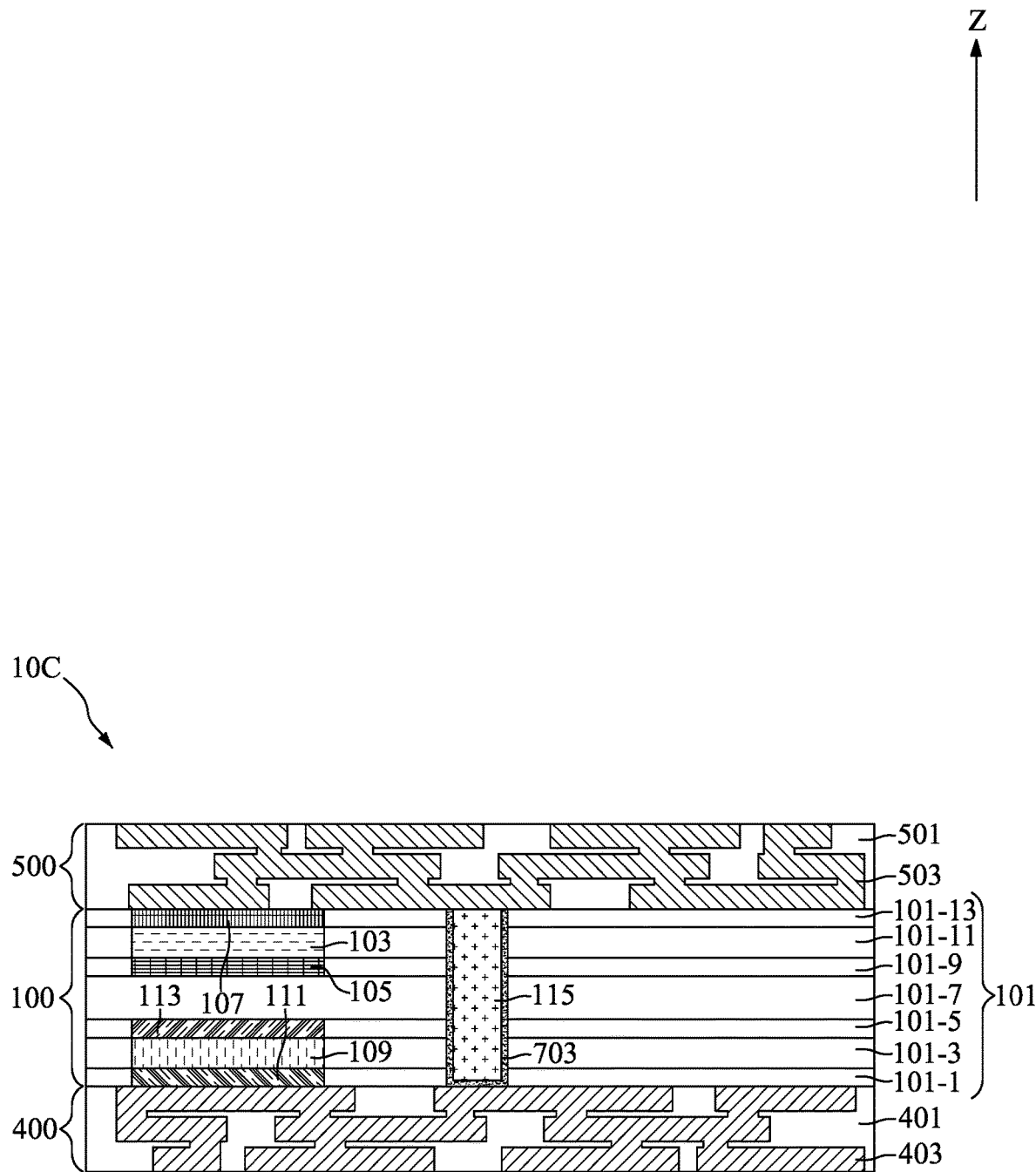

With reference to FIG. 3, in the semiconductor device 10C, a barrier layer 703 may be disposed on the sides of the connection conductive layer 115 and the bottom surface of the connection conductive layer 115. The barrier layer 703 may have a thickness between about 11 angstroms and about 13 angstroms. The barrier layer 703 may be formed of, for example, titanium nitride, tantalum nitride, titanium, tantalum, titanium tungsten, the like, or a combination thereof. The barrier layer 703 may improve the adhesion between the connection conductive layer 115 and the connection dielectric layer 101.

Figure 4:
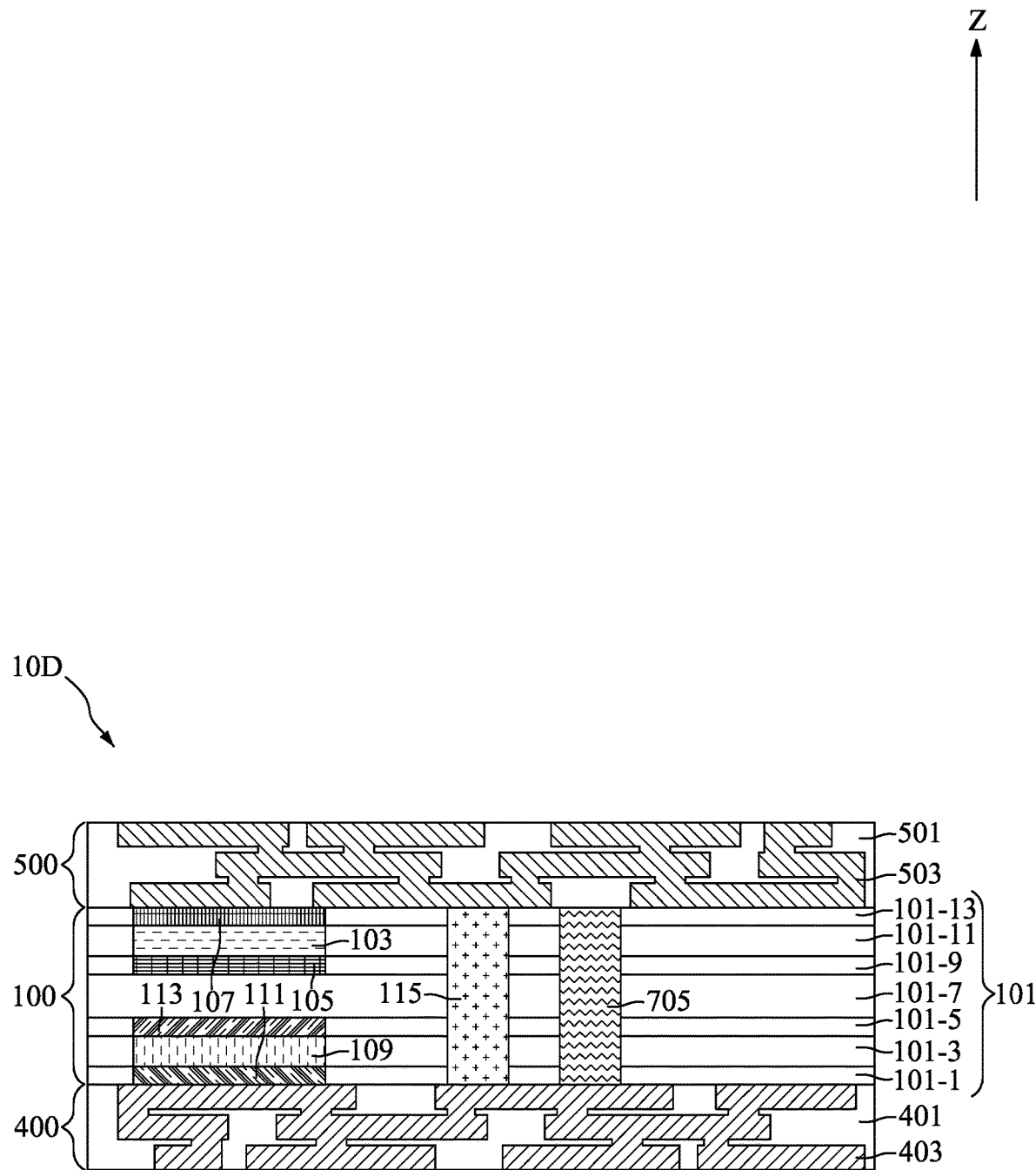

With reference to FIG. 4, in the semiconductor device 10D, an alleviation layer 705 may be disposed in the connection dielectric layer 101. The thickness of the alleviation layer 705 may be equal to or less than the thickness of the connection conductive layer 115. In some embodiments, the alleviation layer 705 may have a dielectric constant less than 2.0. In some embodiments, the alleviation layer 705 may be porous. The alleviation layer 705 may be formed from an energy-removable material, as will be illustrated later.

The alleviation layer 705 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The alleviation layer 705 may have a porosity between 25% and 100%. It should be noted that, when the porosity is 100%, it means the alleviation layer 705 includes only an empty space and the alleviation layer 705 may be regarded as an air gap. In some embodiments, the porosity of the alleviation layer 705 may be between 45% and 95%. The plurality of empty spaces of the alleviation layer 705 may be filled with air. As a result, a dielectric constant of the alleviation layer 705 may be significantly lower than a layer formed of, for example, silicon oxide. Therefore, the alleviation layer 705 may significantly reduce the parasitic capacitance of the connection structure 100. That is, the alleviation layer 705 may significantly alleviate an interference effect between electrical signals induced or applied to the connection structure 100.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

Figure 5:
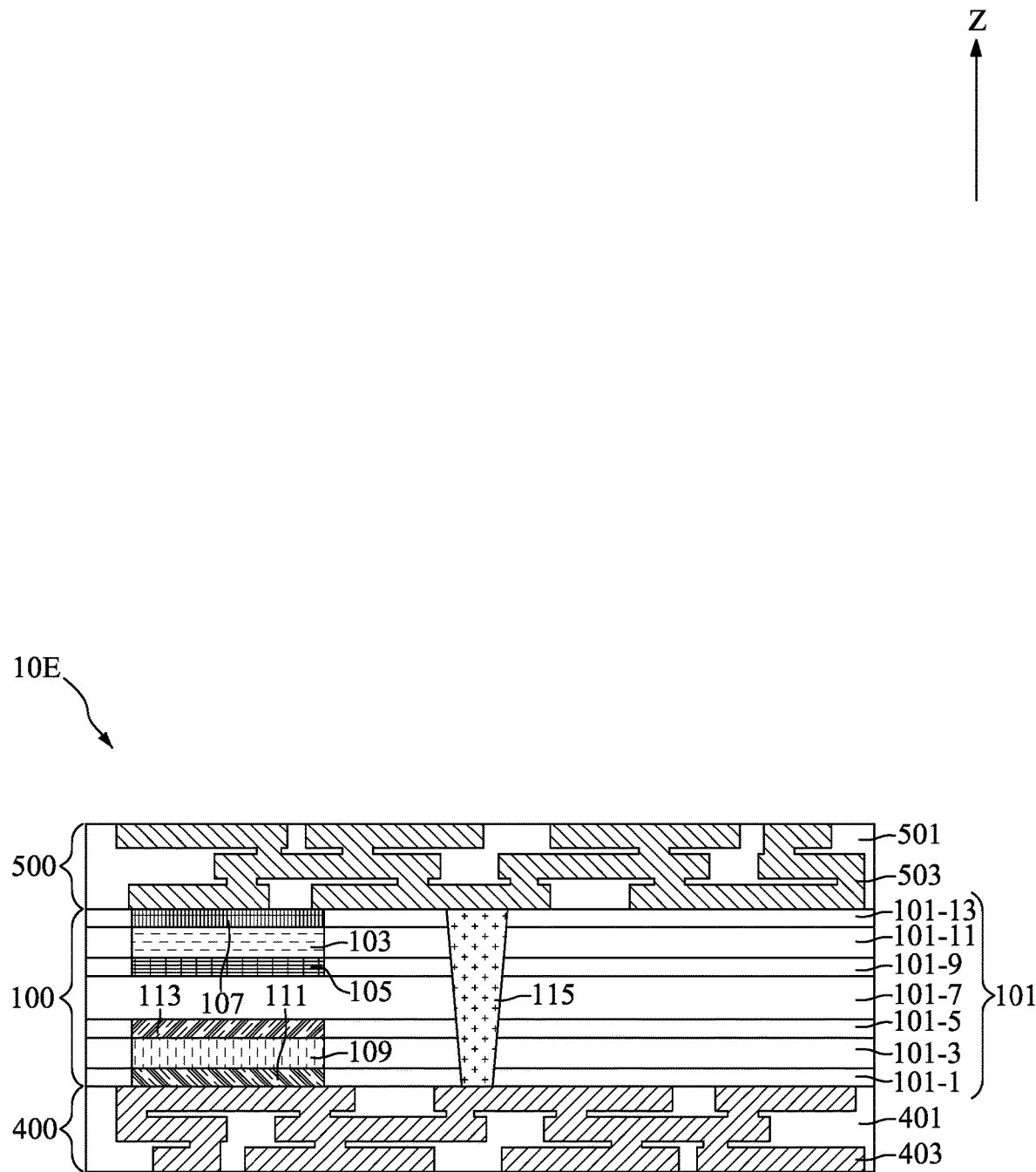

With reference to FIG. 5, in the semiconductor device 10E, the sides of the connection conductive layer 115 may have a slanted cross-sectional profile. In some embodiments, a width of the connection conductive layer 115 may gradually become wider from bottom to top along the direction Z. In some embodiments, the connection conductive layer 115 as a whole may have a uniform slope.

Figure 6:
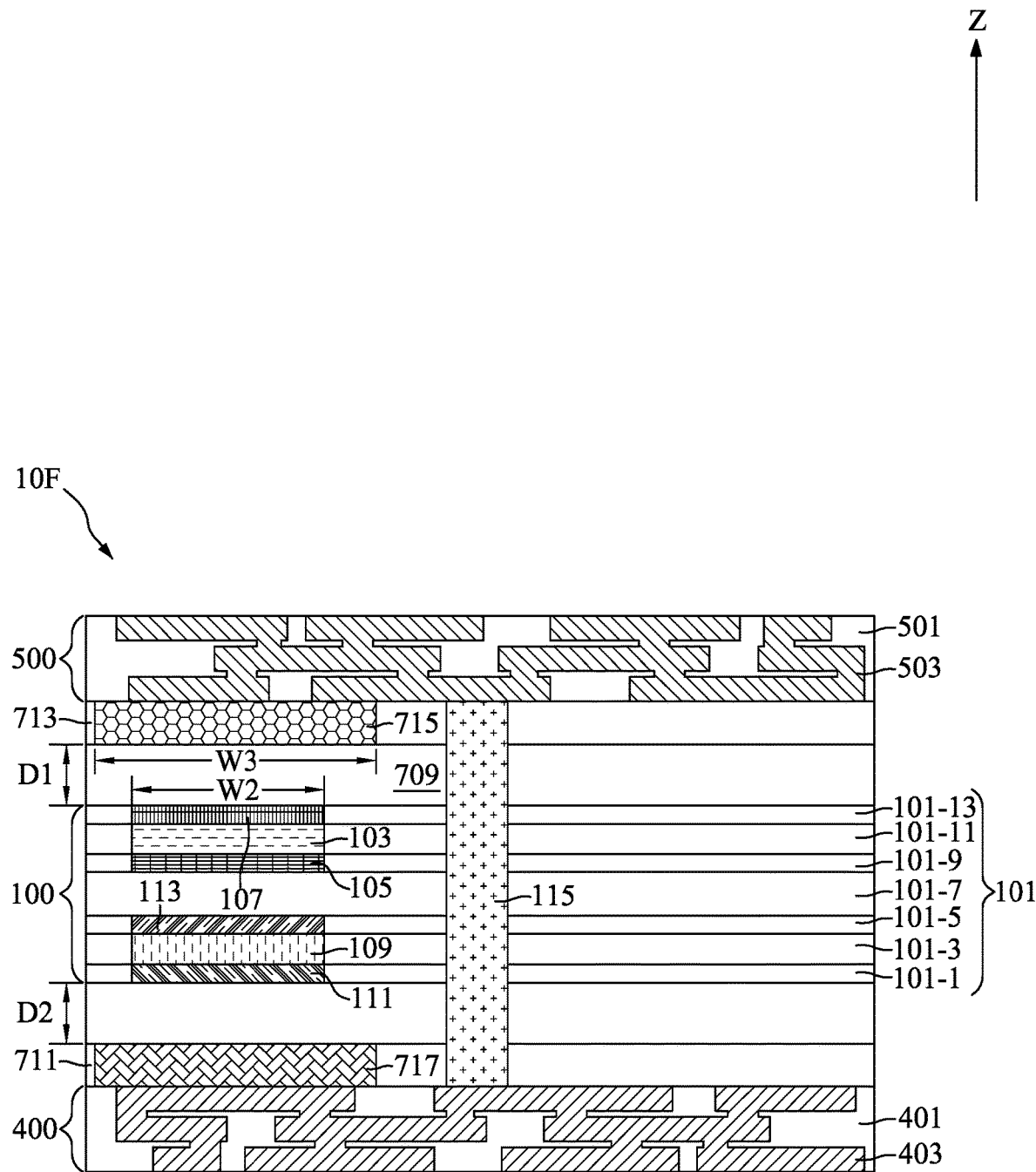

With reference to FIG. 6, in the semiconductor device 10F, a plurality of insulating layers 707, 709, 711, 713 may be respectively correspondingly disposed between the first redistribution structure 400 and the connection structure 100 and between the second redistribution structure 500 and the connection structure 100. The connection conductive layer 115 may disposed penetrating the plurality of insulating layers 707, 709, 711, 713 and the connection dielectric layer 101.

With reference to FIG. 6, a first magnetic layer 715 may be disposed above the first top protection layer 107 and in the insulating layer 713. The first magnetic layer 715 may be parallel to the first top protection layer 107. The insulating layer 709 may separate the first top protection layer 107 and the first magnetic layer 715. A second magnetic layer 717 may be disposed below the second bottom protection layer 111 and in the insulating layer 711. The second magnetic layer 717 may be parallel to the second bottom protection layer 111. The insulating layer 707 may separate the second bottom protection layer 111 and the second magnetic layer 717.

With reference to FIG. 6, the first magnetic layer 715 and the second magnetic layer 717 may be formed of, for example, a ferromagnetic material such as iron, nickel, cobalt, the like, or the combination thereof. Either the first magnetic layer 715 or the second magnetic layer 717 may be permanently magnetized to provide a magnetic flux. The plurality of insulating layers 707, 709, 711, 713 may be formed of, for example, silicon nitride or silicon oxide which may not affect the magnetization resonance of the first bottom protection layer 105, the first top protection layer 107, the second bottom protection layer 111, and the second top protection layer 113.

With reference to FIG. 6, a distance D1 between the first magnetic layer 715 and the first top protection layer 107 may be equal to a distance D2 between the second magnetic layer 717 and the second bottom protection layer 111. A width W3 (or dimension) of the first magnetic layer 715 and the second magnetic layer 717 may be greater than the width W2 (or dimension) of the first top protection layer 107 and the second bottom protection layer 111. The greater width (or dimension) of the first magnetic layer 715 and the second magnetic layer 717 may prevent the first top protection layer 107 or the second bottom protection layer 111 from affecting by the fringing effect of the magnetic field near the edges of the first magnetic layer 715 and the second magnetic layer 717.

In some embodiments, additional insulating layers (not shown in FIG. 6) may be respectively correspondingly disposed between the first magnetic layer 715 and the second redistribution conductive layer 503 and between the second magnetic layer 717 and the first redistribution conductive layer 403.

With the presence of the first magnetic layer 715 and the second magnetic layer 717, the first bottom protection layer 105, the first top protection layer 107, the second bottom protection layer 111, and the second top protection layer 113 may resonance with the magnetic field originated form the first magnetic layer 715 and the second magnetic layer 717 and the first bottom protection layer 105, the first top protection layer 107, the second bottom protection layer 111, and the second top protection layer 113 may serve as filters.

Figure 7:
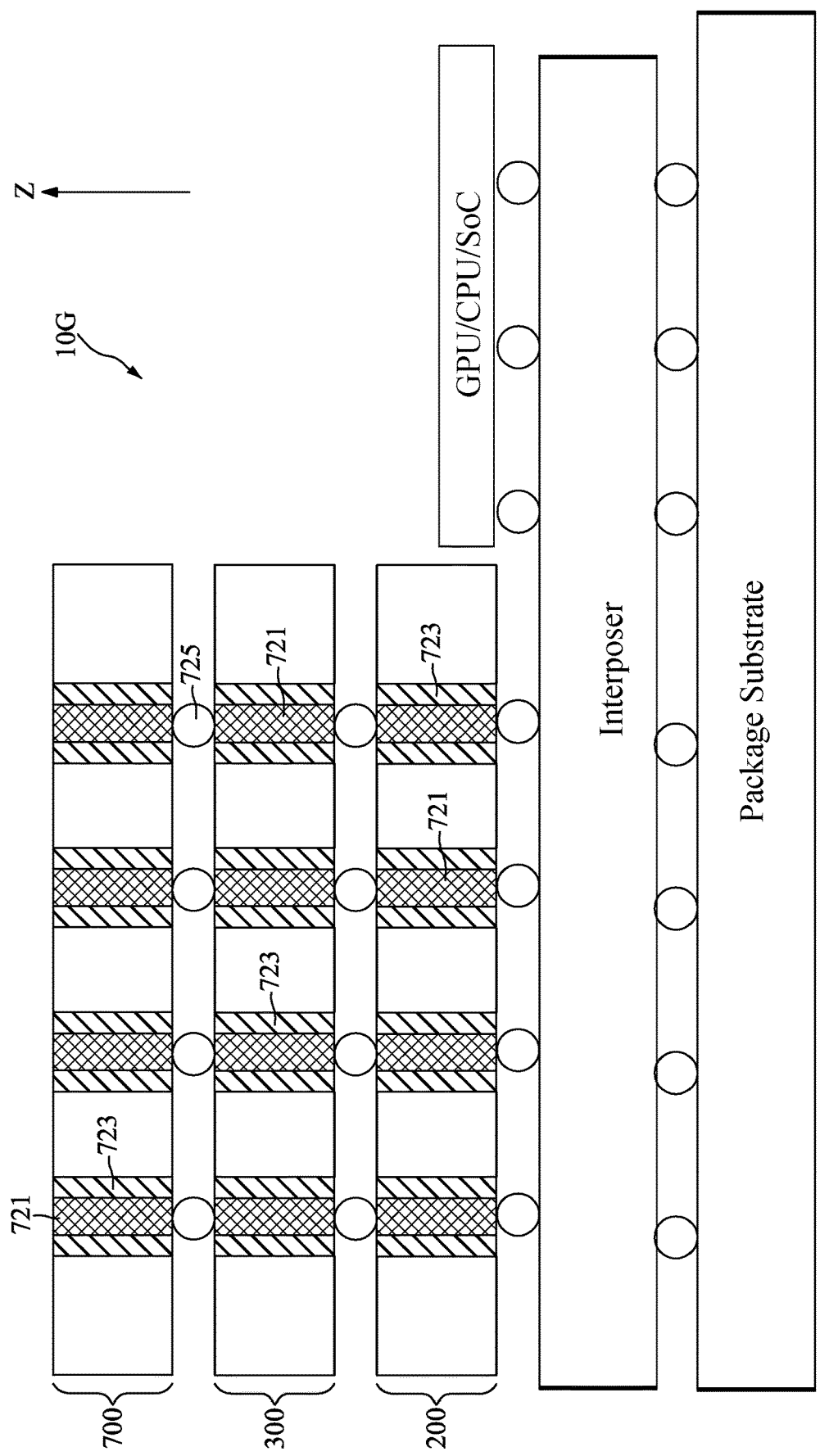
FIG. 7 illustrates, in a schematic cross-sectional diagram, a semiconductor device such as a 3D memory architecture in accordance with one embodiment of the present disclosure.

FIG. 7 illustrates, in a schematic cross-sectional diagram, a semiconductor device 10G such as a 3D memory architecture in accordance with one embodiment of the present disclosure. In some embodiments, the semiconductor device 10G comprises a package substrate, an interposer disposed on the package substrate, a processor die such as GPU, CPU, SoC die disposed on a first site of the interposer, and a memory stack disposed on a second site of the interposer. The interposer shown in FIGS. 2-6 may be used in the semiconductor device 10G.

With reference to FIG. 7, in the semiconductor device 10G, a plurality of semiconductor memory dies 200, 300, 700 such as DRAM (dynamic random access memory) dies may be vertically stacked by a plurality of microbumps 725. Each of the plurality of semiconductor dies 200, 300, 700 may have a similar structure with the first semiconductor die 200 illustrated in FIG. 1 but is not limited thereto. In some embodiments, the plurality of semiconductor dies 200, 300, 700 may be provided for memory function. In other words, the plurality of semiconductor dies 200, 300, 700 may be a memory stack. In some embodiments, some of the plurality of semiconductor dies 200, 300, 700 may be provided for logic function.

With reference to FIG. 7, a plurality of through silicon vias 721 may be respectively correspondingly disposed in the plurality of semiconductor dies 200, 300, 700 and may be electrically coupled through the plurality of microbumps 725. The plurality of through silicon vias 721 may be formed of, for example, copper, aluminum, titanium, the like, or a combination thereof. One of the plurality of through silicon vias 721 may serve as part of a VDD trace and is electrically coupled to a supply voltage. Another one of the plurality of through silicon vias 721 may serve as part of a $V_{SS}$ trace and is electrically coupled to a ground potential.

With reference to FIG. 7, a plurality of protection liners 723 may be disposed on sides of the plurality of through silicon vias 721. The plurality of protection liners 723 may be formed of, for example, manganese-zinc ferrite, nickel-zinc ferrite, cobalt ferrite, strontium ferrite, barium ferrite, lithium ferrite, lithium-zinc ferrite, single crystal yttrium iron garnet, gallium substituted single crystal yttrium iron garnet, or the like. The plurality of protection liners 723 may provide similar functionality with the first bottom protection layer 105, the first top protection layer 107, the second bottom protection layer 111, and the second top protection layer 113 illustrated in FIG. 1.

With reference to FIG. 7, in some embodiments, the interposer has first bond pads on a first side and second bond pads on a second side, the memory stack is attached to the first bond pads on the first side of the interposer by conductive bumps such as microbumps, the processor die is attached to the first bond pads on the first side of the interposer by conductive bumps such as microbumps, and the package substrate is attached to the second bond pads on the second side of the interposer by conductive bumps such as microbumps.

Figure 8:
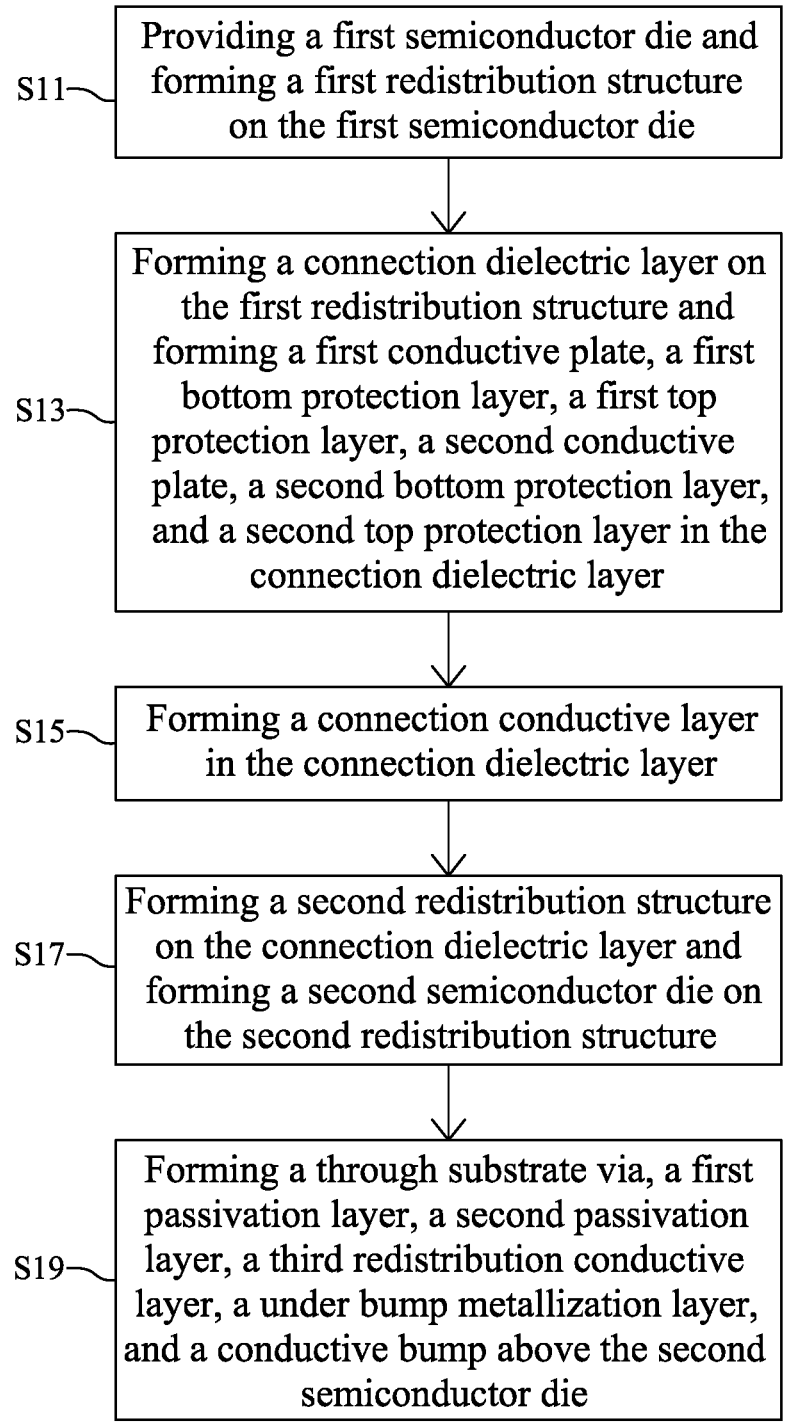
FIG. 8 illustrates, in a flowchart diagram form, a method for fabricating a semiconductor device in accordance with one embodiment of the present disclosure.

FIG. 8 illustrates, in a flowchart diagram form, a method 20 for fabricating a semiconductor device 10A in accordance with one embodiment of the present disclosure. FIGS. 9 to 14 illustrate, in schematic cross-sectional view diagrams, a flow for fabricating the semiconductor device 10A in accordance with one embodiment of the present disclosure.

Figure 9:
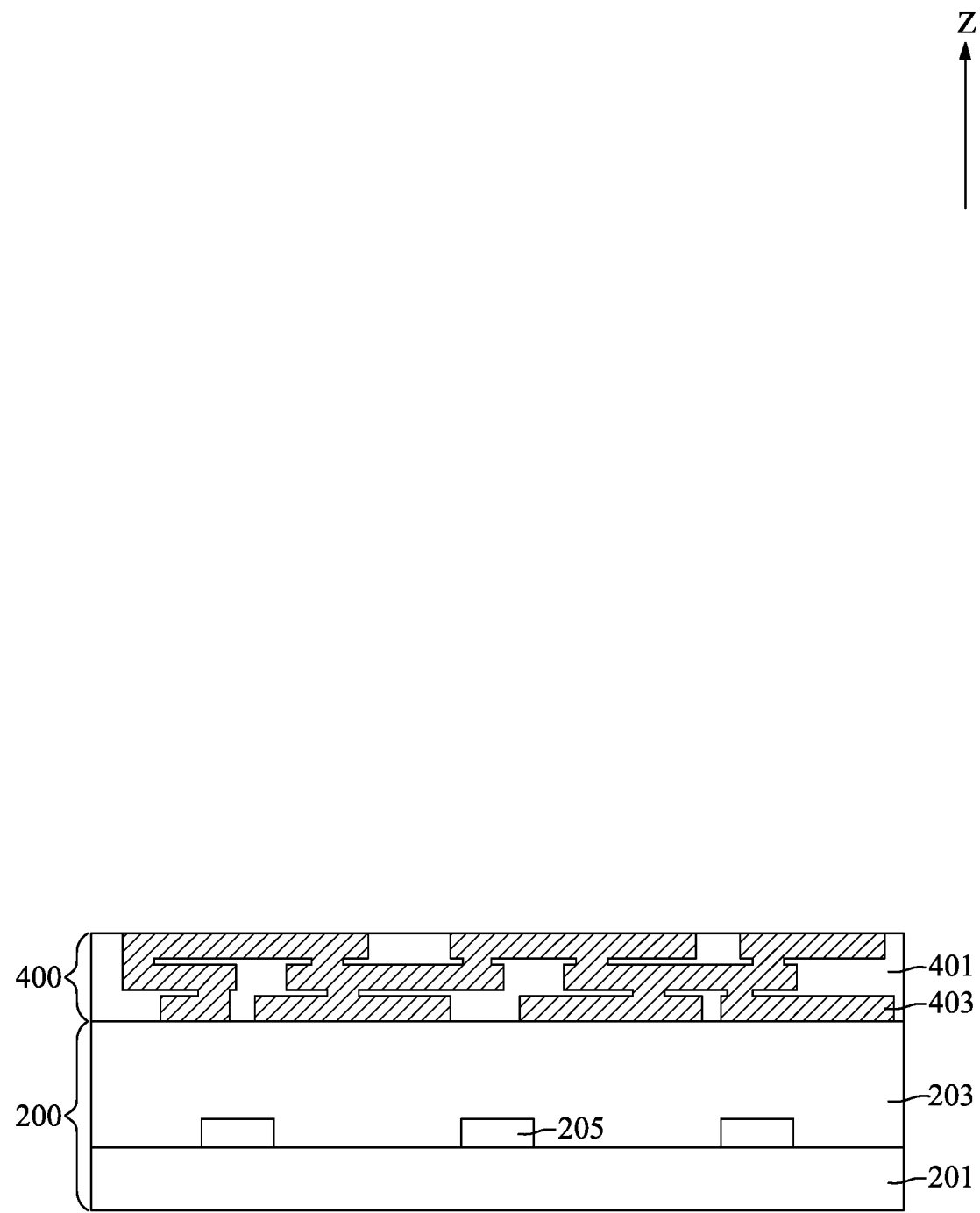
FIGS. 9 to 14 illustrate, in schematic cross-sectional view diagrams, a flow for fabricating the semiconductor device in accordance with one embodiment of the present disclosure.

With reference to FIGS. 8 and 9, at step S11, a first semiconductor die 200 may be provided and a first redistribution structure 400 may be formed on the first semiconductor die 200.

With reference to FIG. 9, the first semiconductor die 200 may include a first substrate 201, a first dielectric layer 203, a plurality of first device elements 205, and a plurality of first conductive features (not shown in FIGS. 9 to 14 for clarity). The first dielectric layer 203 may be formed on the first substrate 201. The plurality of first device elements 205 and the plurality of first conductive features may be formed in the first dielectric layer 203.

With reference to FIG. 9, in some embodiments, the first redistribution structure 400 may be formed on the first semiconductor die 200 by performing a series of semiconductor processes, such as deposition, photolithography, etch, metallization, and planarization, on the top surface of the first semiconductor die 200. The first redistribution structure 400 may include a first redistribution dielectric layer 401 and a first redistribution conductive layer 403. The first redistribution dielectric layer 401 may be formed on the first dielectric layer 203. The first redistribution conductive layer 403 may be formed in the first redistribution dielectric layer 401.

In some embodiments, the first redistribution structure 400 may be formed separately and then be bonded to the first semiconductor die 200 through a bonding process. A thermal treatment may be performed to achieve a hybrid bonding between elements of the first redistribution structure 400 and the first semiconductor die 200 for the bonding process. The hybrid bonding may include an oxide-to-oxide bonding and a metal-to-metal bonding. The oxide-to-oxide bonding may originate from the bonding between the first dielectric layer 203 and the first redistribution dielectric layer 401. The metal-to-metal bonding may originate from the bonding between the plurality of first conductive features and the first redistribution conductive layer 403. A temperature of bonding process may be between about 300° C. and about 450° C.

With reference to FIG. 8 and FIGS. 10 to 12, at step S13, a connection dielectric layer 101 may be formed on the first redistribution structure 400 and a first conductive plate 103, a first bottom protection layer 105, a first top protection layer 107, a second conductive plate 109, a second bottom protection layer 111, and a second top protection layer 113 may be formed in the connection dielectric layer 101.

Figure 10:
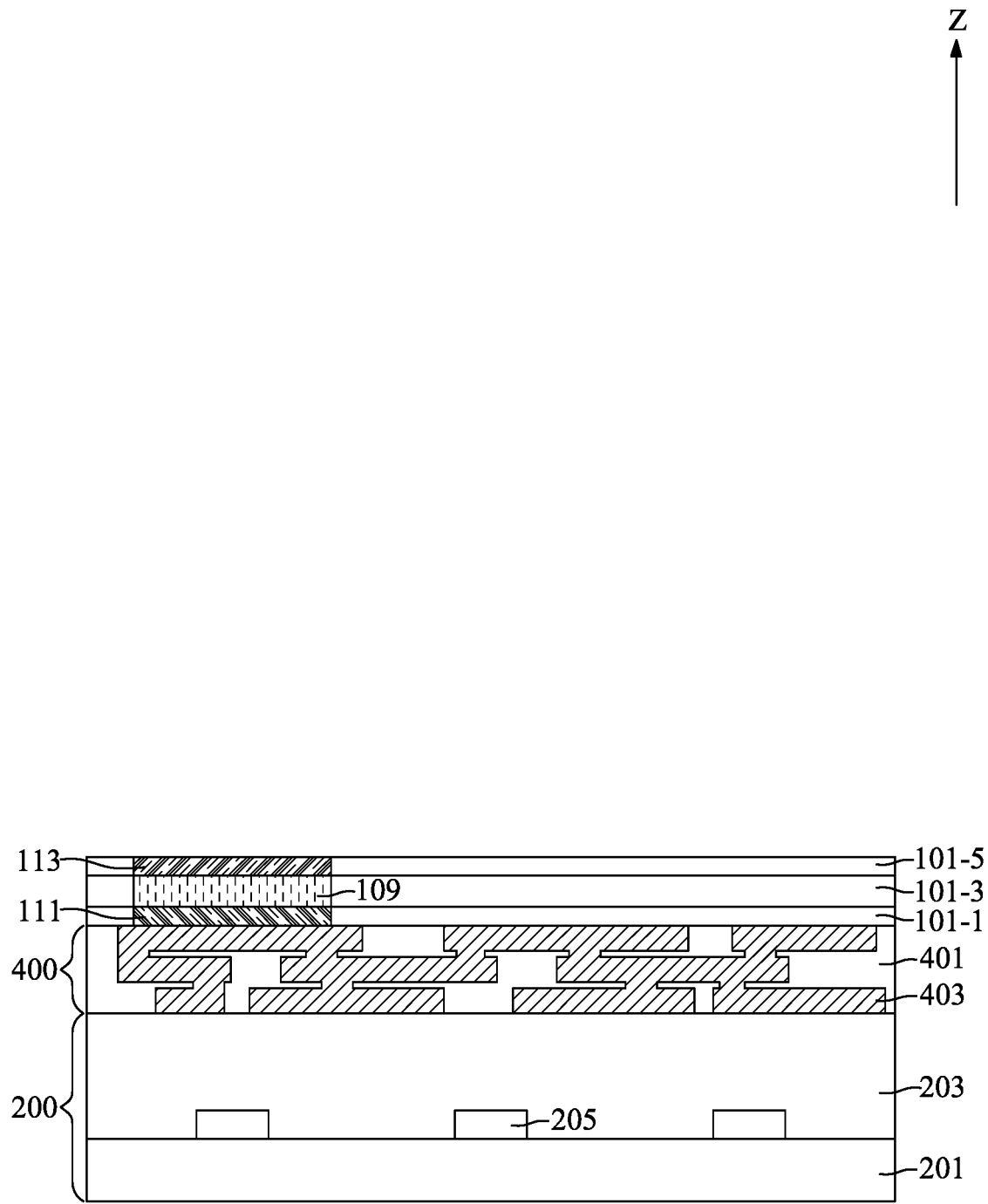

With reference to FIG. 10, a sub-layer 101-1 may be deposited on the first redistribution structure 400. A photolithography process may be performed to define a position of the second bottom protection layer 111. After the photolithography process, an etch process may be performed to form an opening. A material such as manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet may be formed in the opening. A planarization process, such as chemical mechanical polishing, may be performed to provide a substantially flat surface for subsequent processing steps and conformally form the second bottom protection layer 111.

With reference to FIG. 10, a sub-layer 101-3 may be deposited on the sub-layer 101-1. A second conductive plate 109 may be formed in the sub-layer 101-3 by a damascene process. A sub-layer 101-5 and a second top protection layer 113 may be formed in a procedure similar to the sub-layer 101-1 and the second bottom protection layer 111. The second bottom protection layer 111 and the second top protection layer 113 may be formed sandwiched the second conductive plate 109.

Figure 11:
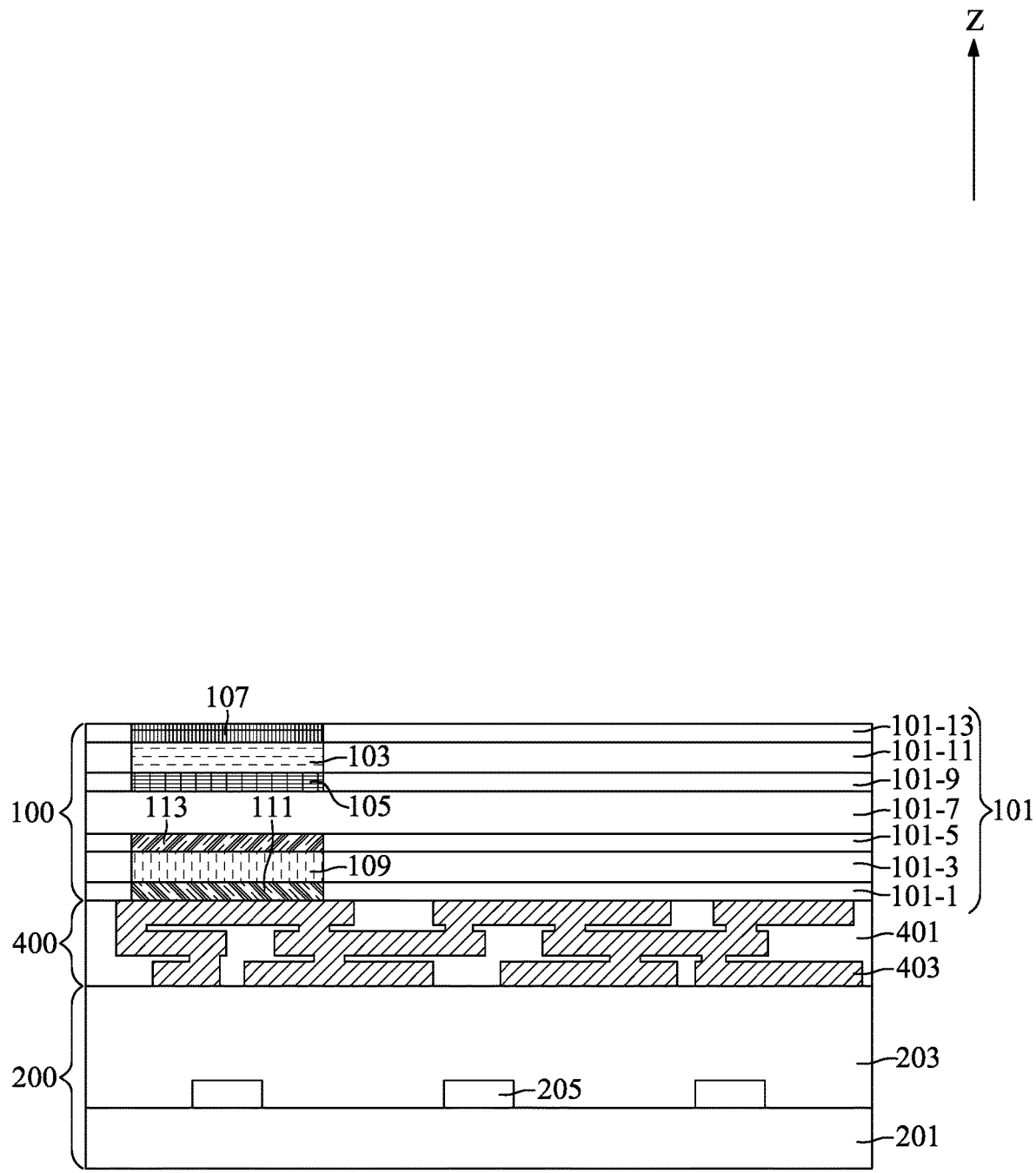

With reference to FIG. 11, sub-layers 101-7, 101-9, 101-11, 101-13 may be sequentially formed on the sub-layer 101-5. The first conductive plate 103, the first bottom protection layer 105, and the first top protection layer 107 may be formed in a procedure similar to that illustrated in FIG. 10. The first top protection layer 107 and the first bottom protection layer 105 may be formed sandwiched the first conductive plate 103. The plurality of sub-layers 101-1, 101-3, 101-5, 101-7, 101-9, 101-11, 101-13 together form the connection dielectric layer 101.

Figure 12:
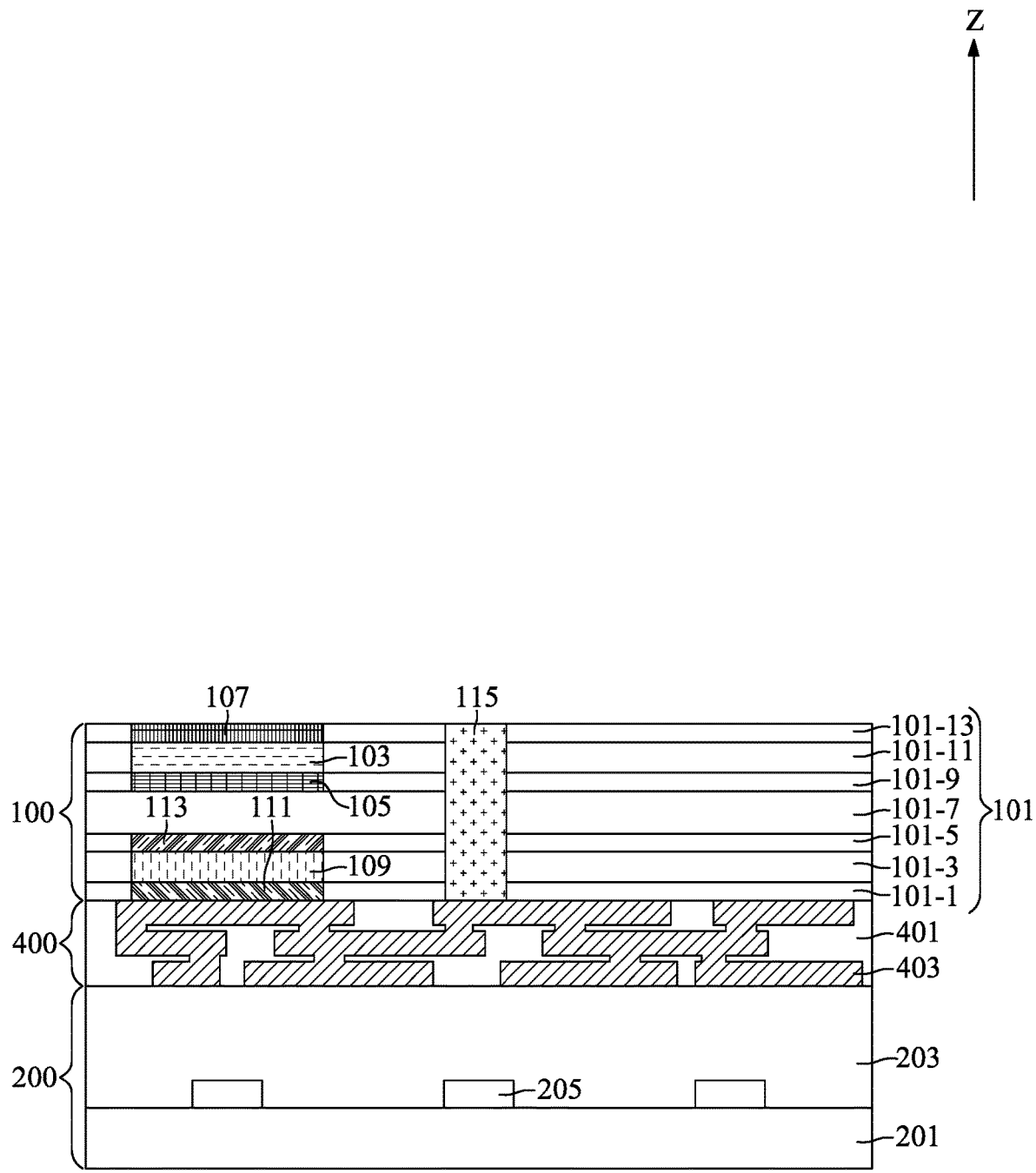

With reference to FIGS. 8 and 12, at step S15, a connection conductive layer 115 may be formed in the connection dielectric layer 101. A photolithography process may be performed to define a position of the connection conductive layer 115. A single step etch process or multiple step etch process may be performed to remove portions of the connection dielectric layer 101 and form an opening so as to penetrate the connection dielectric layer 101. A conductive material such as copper, aluminum, or titanium may be deposited into the opening by a deposition process. After the deposition process, a planarization process, such as chemical mechanical polishing, may be performed to remove excess material, provide a substantially flat surface for subsequent processing steps, and conformally form the connection conductive layer 115. The connection conductive layer 115, the connection dielectric layer 101, the first conductive plate 103, the first bottom protection layer 105, the first top protection layer 107, the second conductive plate 109, the second bottom protection layer 111, and the second top protection layer 113 together form the connection structure 100.

Figure 13:
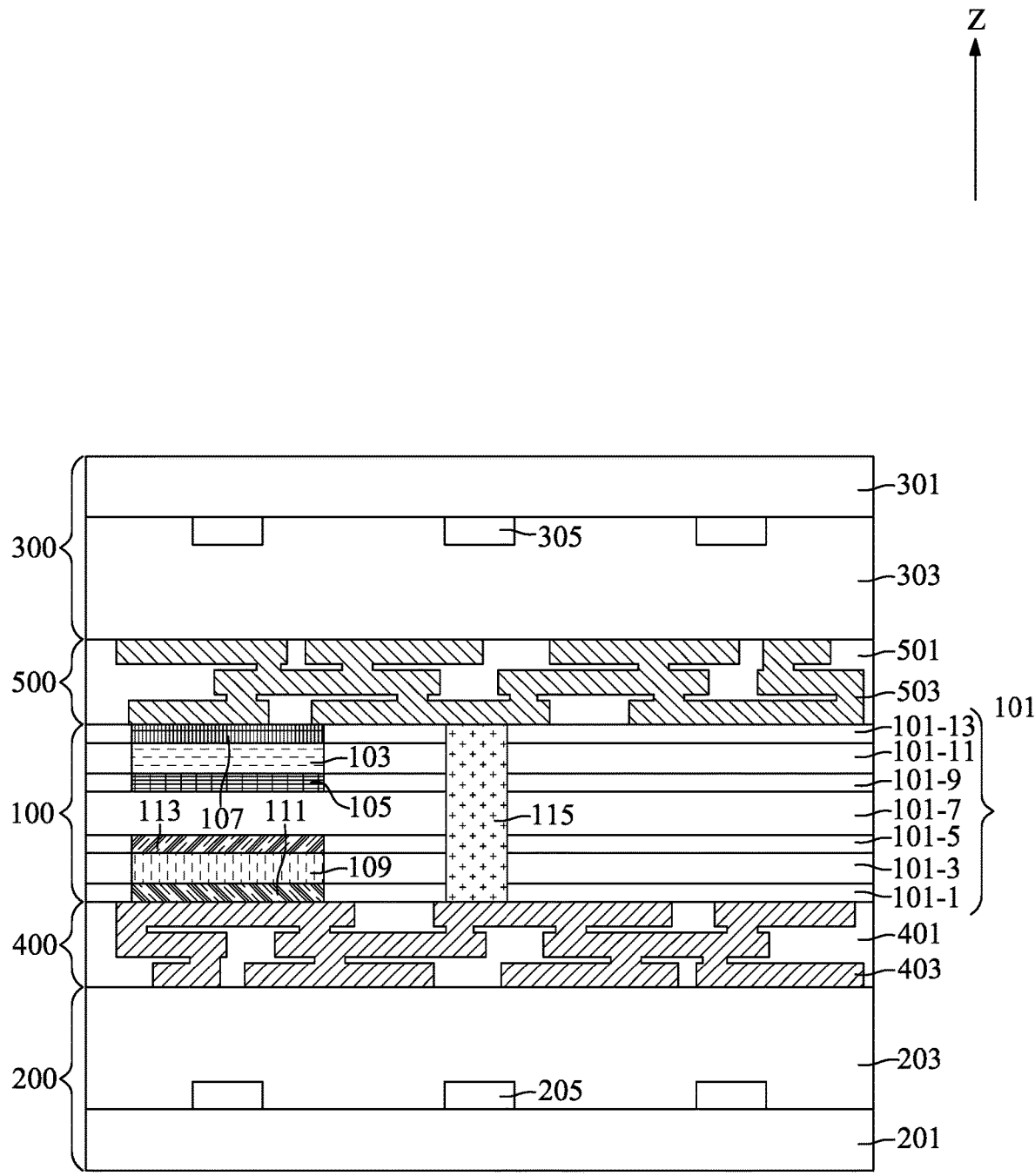

With reference to FIGS. 8 and 13, at step S17, a second redistribution structure 500 may be formed on the connection dielectric layer 101 and a second semiconductor die 300 may be formed on the second redistribution structure 500.

With reference to FIG. 13, the second redistribution structure 500 may be formed on the connection structure 100 by performing a series of semiconductor processes, such as deposition, photolithography, etch, metallization, and planarization, on the top surface of the connection dielectric layer 101. The second redistribution structure 500 may include a second redistribution dielectric layer 501 and a second redistribution conductive layer 503. The second redistribution dielectric layer 501 may be formed on the connection dielectric layer 101. The second redistribution conductive layer 503 may be formed in the second redistribution dielectric layer 501. In some embodiments, the second redistribution structure 500 may be formed separately and then be bonded to the connection structure 100 through a bonding process similar to that illustrated in FIG. 9.

With reference to FIG. 13, the second semiconductor die 300 may be separately prepared and then be bonded to the second redistribution structure 500 through a bonding process similar to that illustrated in FIG. 9. In some embodiments, the second semiconductor die 300 may be separately prepared and the second redistribution structure 500 may be formed on the second semiconductor die 300. Subsequently, the second semiconductor die 300 and the second redistribution structure 500 may be bonded to the connection structure 100 through a bonding process similar to that illustrated in FIG. 9.

Figure 14:
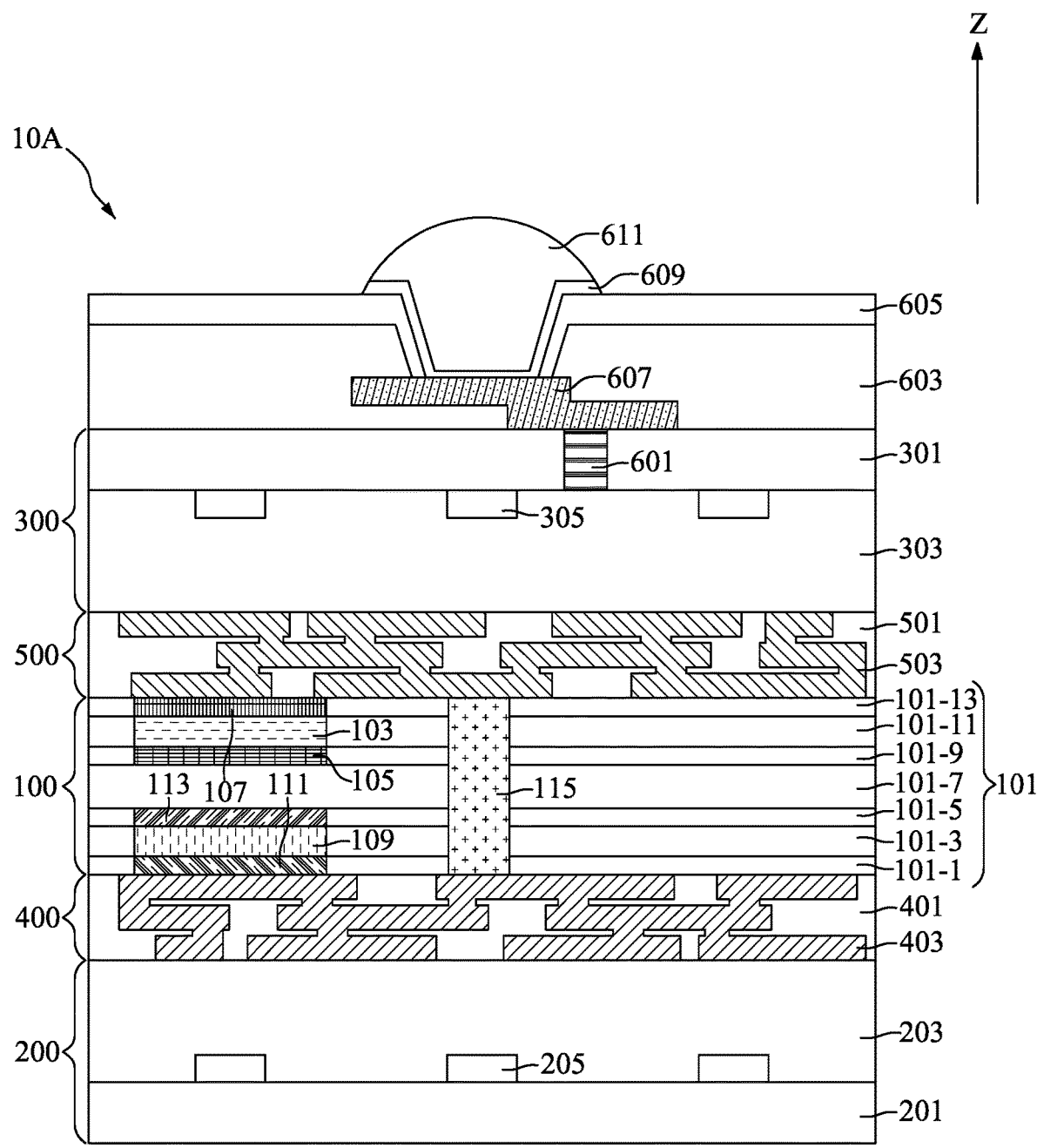

With reference to FIGS. 8 and 14, at step S19, a through substrate via 601, a first passivation layer 603, a second passivation layer 605, a third redistribution conductive layer 607, a under bump metallization layer 609, and a conductive bump 611 may be formed above the second semiconductor die 300.

With reference to FIG. 14, the through substrate via 601 may be formed in a second substrate 301 of the second semiconductor die 300. In some embodiments, a thinning process may be performed on the second substrate 301 before formation of the through substrate via 601 by using an etching process, a chemical polishing process, or a grinding process to reduce a thickness of the second substrate 301. The first passivation layer 603 and the second passivation layer 605 may be sequentially formed on the second substrate 301. The third redistribution conductive layer 607 may be formed in the first passivation layer 603. A portion of the first passivation layer 603 and a portion of the second passivation layer 605 may be recessed to form an opening to expose a portion of a top surface of the third redistribution conductive layer 607. The under bump metallization layer 609 and the conductive bump 611 may be sequentially formed in the opening.

Figure 15:
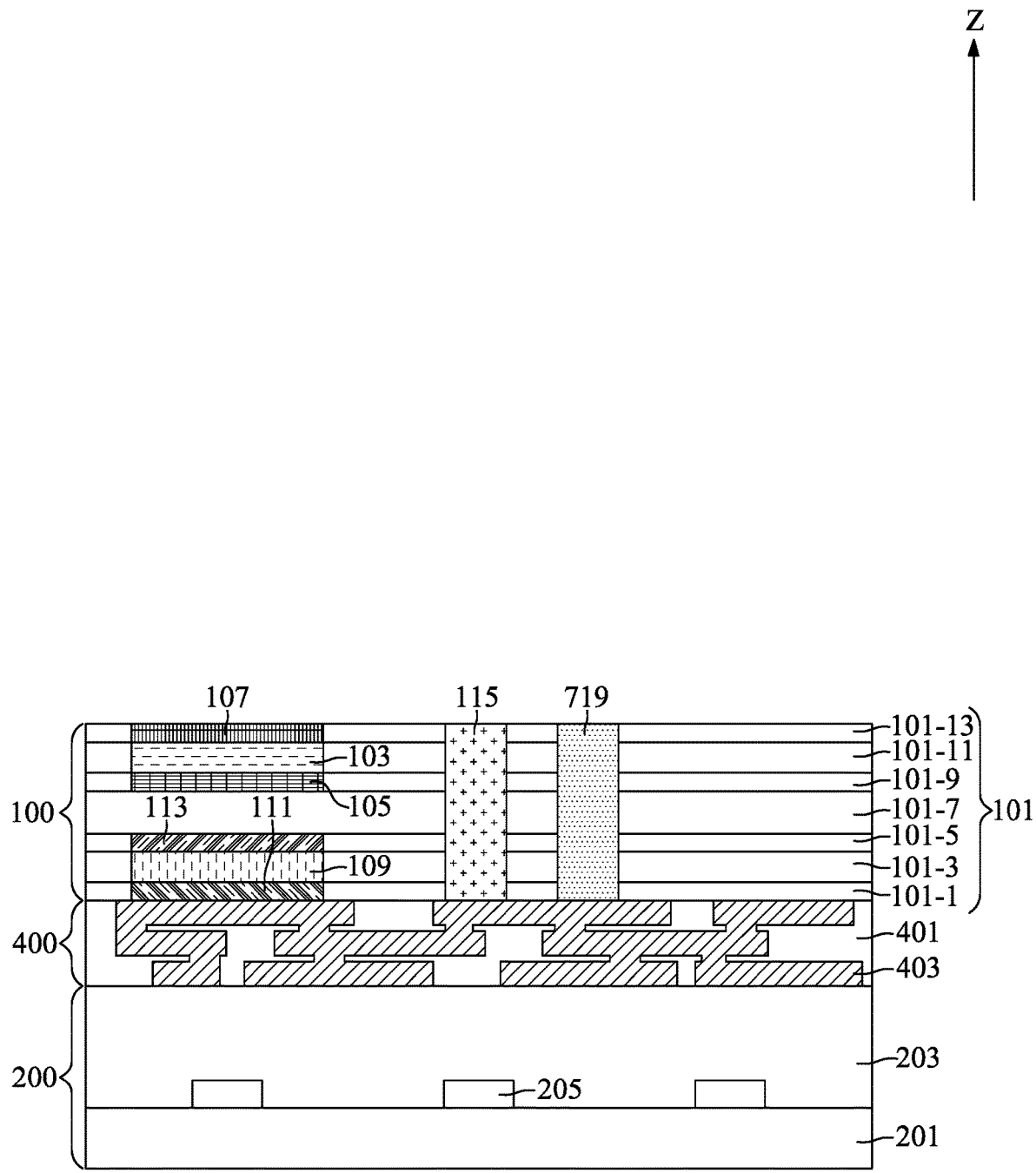
FIGS. 15 and 16 illustrate, in schematic cross-sectional view diagrams, part of a flow for fabricating the semiconductor device in accordance with one embodiment of the present disclosure.
Figure 16:
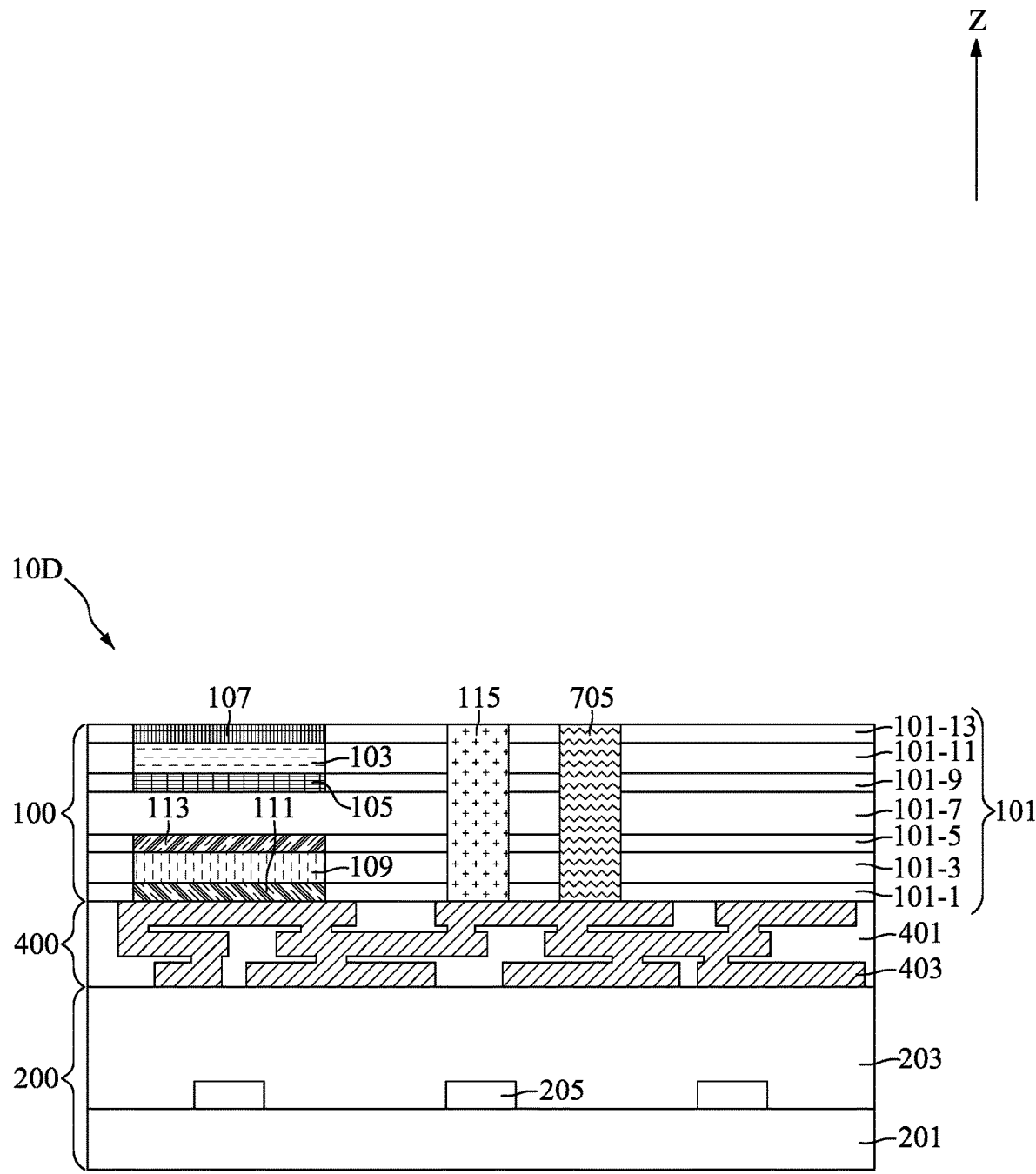

FIGS. 15 and 16 illustrate, in schematic cross-sectional view diagrams, part of a flow for fabricating the semiconductor device 10D in accordance with one embodiment of the present disclosure.

With reference to FIG. 15, an intermediate semiconductor device as illustrated in FIG. 12 may be provided. A photolithography process may be performed to define a position of the alleviation layer 705. After the photolithography process, an etch process, such as an anisotropic dry etch process, may be performed to remove portions of the connection dielectric layer 101 and form an opening. A layer of energy-removable material 719 may be filled in the opening. A planarization process, such as chemical mechanical polishing, may be performed to remove excess material and provide a substantially flat surface for subsequent processing steps. The energy-removable material 719 may include a material such as a thermal decomposable material, a photonic decomposable material, an e-beam decomposable material, or a combination thereof. For example, the energy-removable material 719 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material.

With reference to FIG. 16, an energy treatment may be performed to the intermediate semiconductor device in FIG. 15 by applying the energy source thereto. The energy source may include heat, light, or a combination thereof. When heat is used as the energy source, a temperature of the energy treatment may be between about 800° C. and about 900° C. When light is used as the energy source, an ultraviolet light may be applied. The energy treatment may remove the decomposable porogen material from the energy-removable material to generate empty spaces (pores), with the base material remaining in place.

FIGS. 17 to 20 illustrate, in schematic cross-sectional view diagrams, part of a flow for fabricating the semiconductor device 10G in accordance with one embodiment of the present disclosure.

Figure 17:
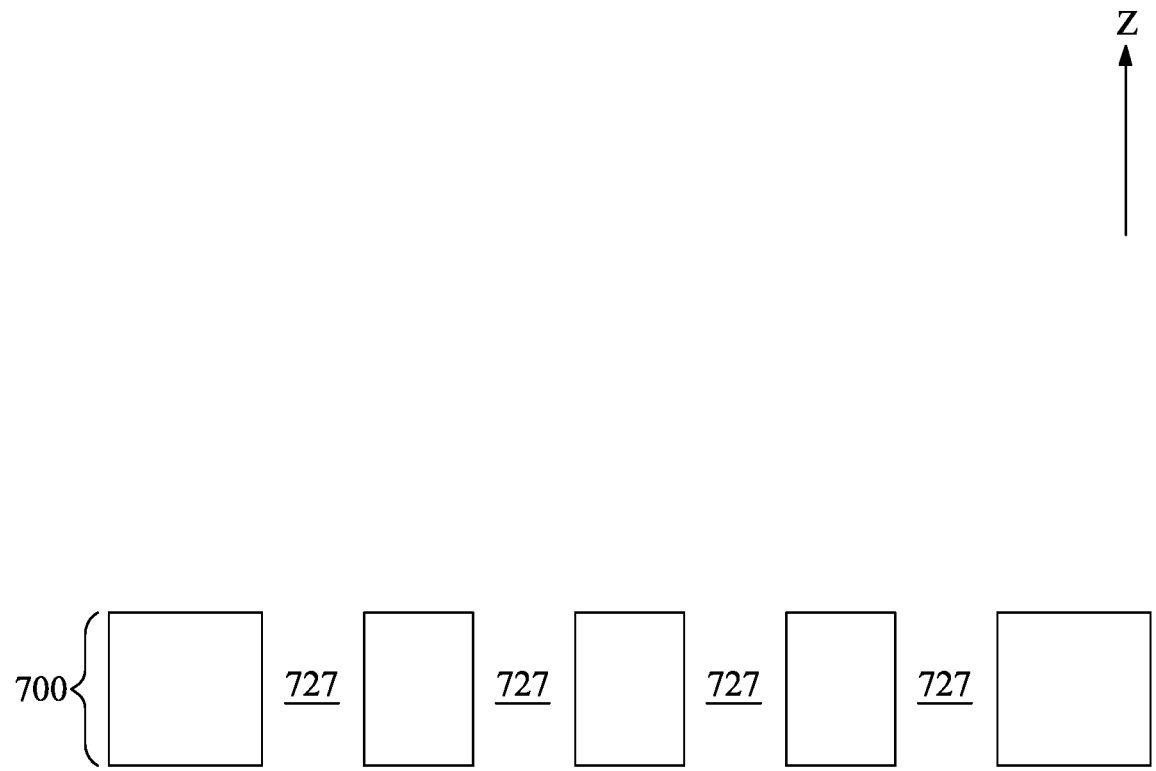
FIGS. 17 to 20 illustrate, in schematic cross-sectional view diagrams, part of a flow for fabricating the semiconductor device in accordance with one embodiment of the present disclosure.
Figure 18:
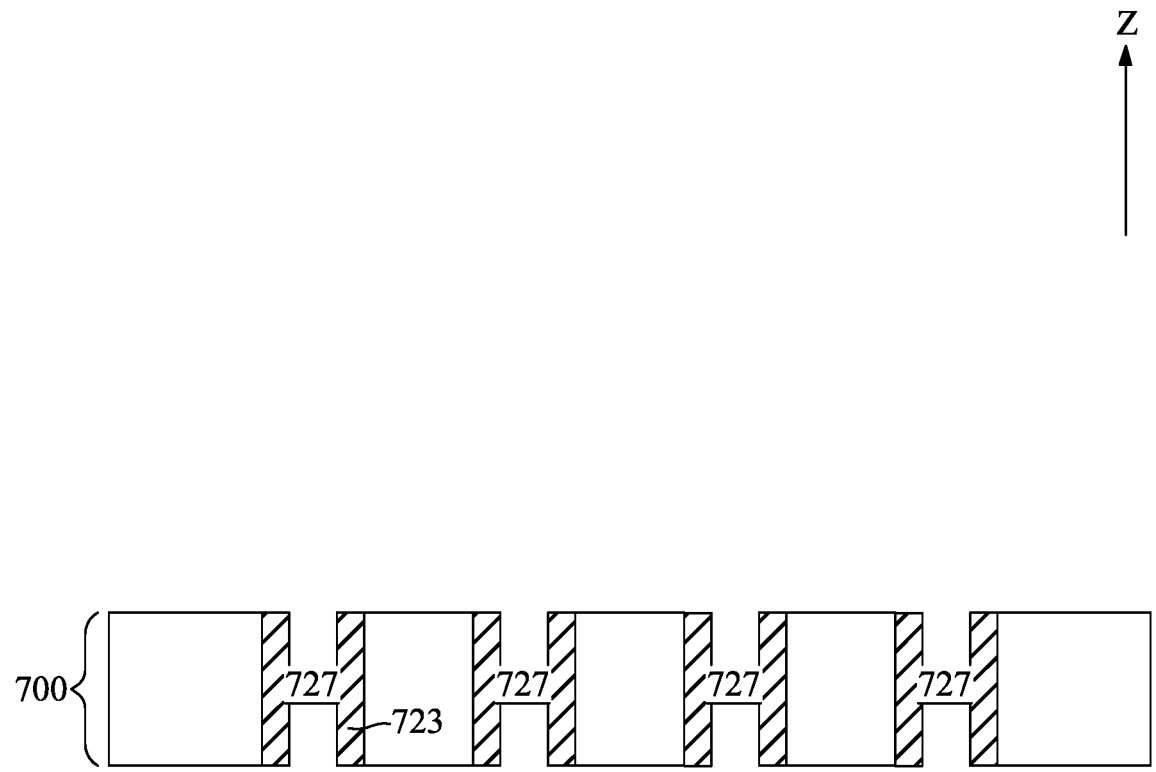
Figure 19:
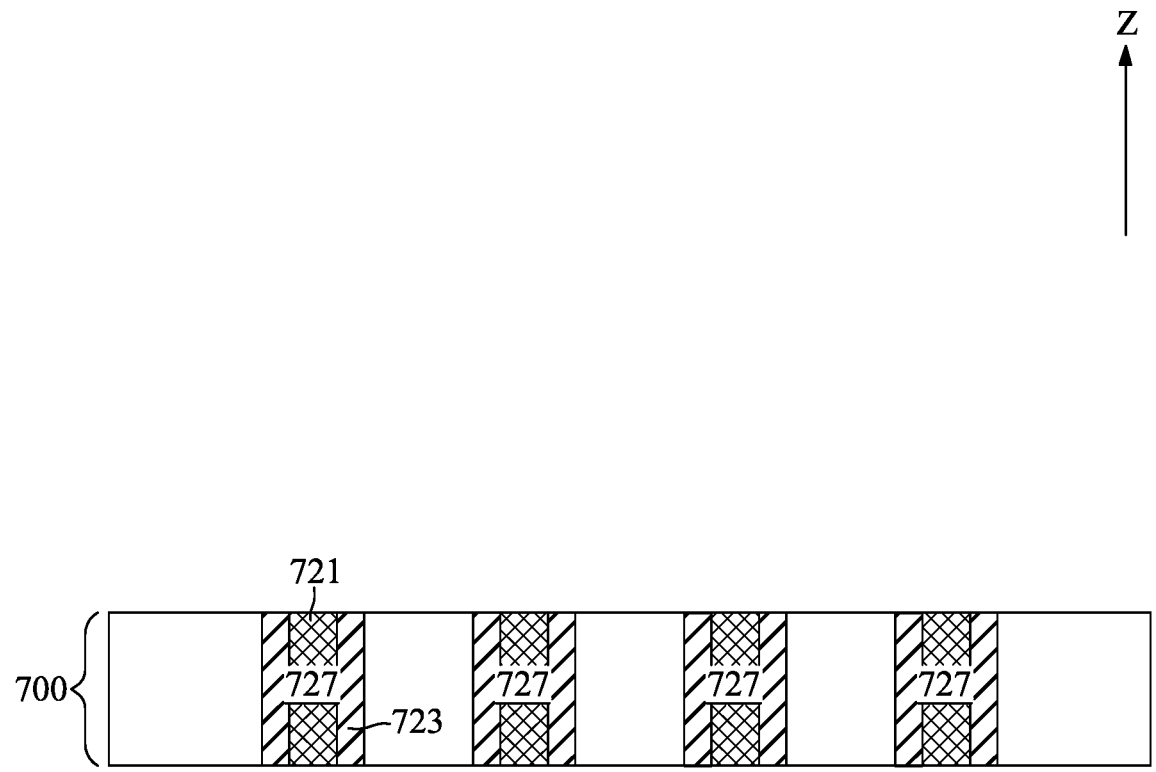
Figure 20:
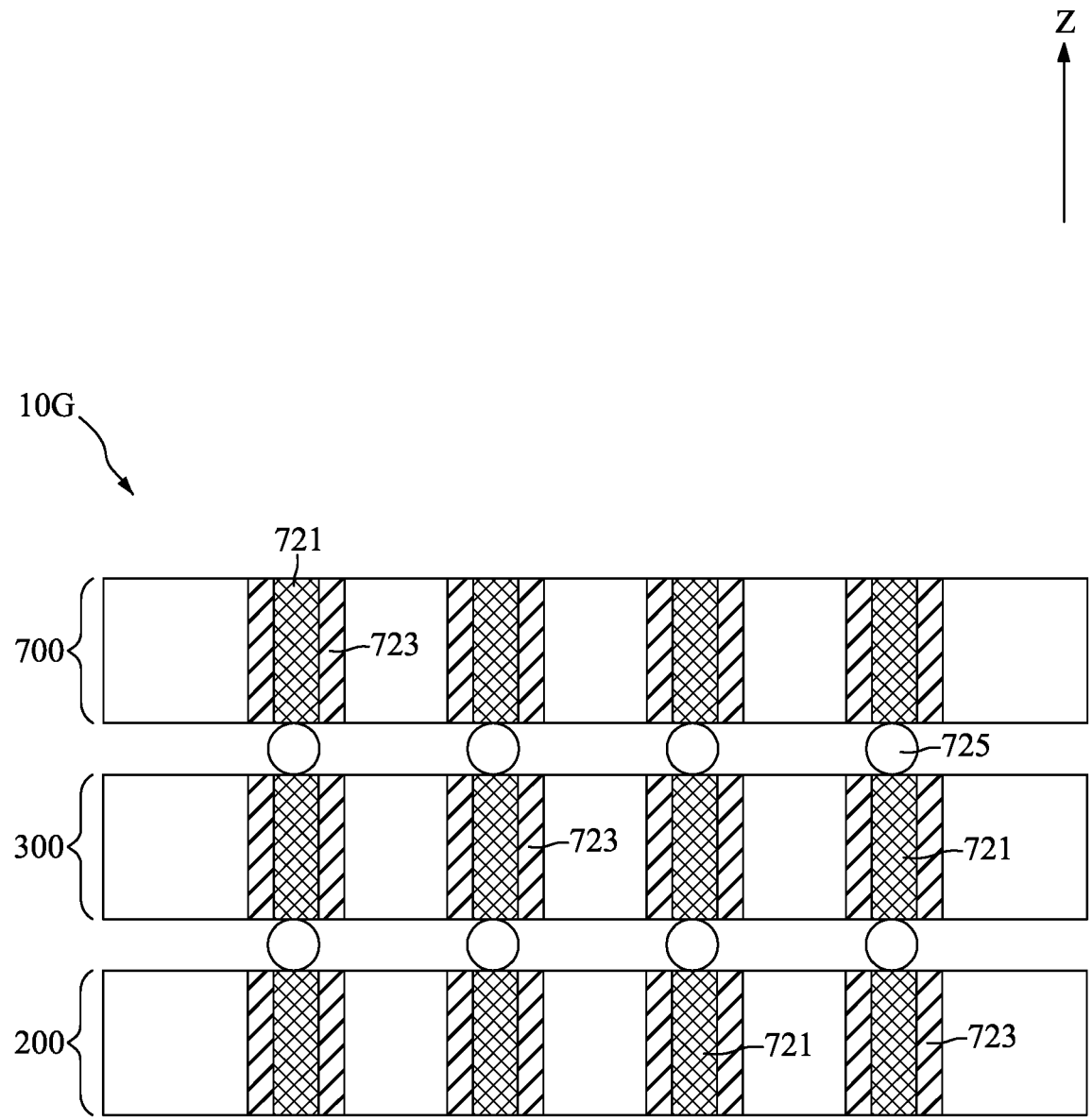

With reference to FIG. 17, a semiconductor die 700 is provided and a plurality of via holes 727 may be formed so as to penetrate the third semiconductor die 700. With reference to FIG. 18, a plurality of protection liners 723 may be formed on sides of the semiconductor die 700 (i.e., sides of the plurality of via holes 727). The plurality of protection liners 723 may be formed of a same material as the first bottom protection layer 105 illustrated in FIG. 1. With reference to FIG. 19, a conductive material may be filled in the plurality of via holes to form a plurality of through silicon vias 721. With reference to FIG. 20, another semiconductor dies 200, 300 may be formed with a procedure similar to the semiconductor die 700. The plurality of semiconductor dies 200, 300, 700 may be vertically stacked and electrically coupled through a plurality of microbumps 725.

Due to the design of the semiconductor device of the present disclosure, the electromagnetic interference may be reduced by the plurality of protection layers 105, 107, 111, 113. Therefore, the performance of the semiconductor device 10A may be improved. In addition, the presence of the alleviation layer 705 may alleviate the parasitic capacitance of the semiconductor device 10D.

One aspect of the present disclosure provides a semiconductor device comprises a plurality of semiconductor memory dies vertically stacked through a plurality of microbumps; a plurality of through silicon vias positioned in the plurality of semiconductor dies and electrically coupled through the plurality of microbumps; and a plurality of protection liners positioned on sides of the plurality of through silicon vias; wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

Another aspect of the present disclosure provides a method for fabricating a semiconductor device, comprising: preparing a plurality of semiconductor memory dies with a plurality of via holes penetrating the semiconductor memory dies; forming a plurality of protection liners on sides of the plurality of via holes; forming a plurality of through silicon vias in the plurality of via holes, wherein the plurality of protection liners surrounds the plurality of through silicon vias; and vertically stacking the plurality of semiconductor memory dies through a plurality of microbumps to form a memory stack, wherein the plurality of microbumps electrically connects the plurality of through silicon vias of two adjacent semiconductor memory dies; wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   a plurality of semiconductor memory dies vertically stacked through a plurality of microbumps;
   a plurality of through silicon vias positioned in the plurality of semiconductor dies and electrically coupled through the plurality of microbumps; and
   a plurality of protection liners positioned on sides of the plurality of through silicon vias;
   wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

2. The semiconductor device of claim 1, wherein the plurality of semiconductor dies are memories.

3. The semiconductor device of claim 2, wherein one of the plurality of through silicon vias is electrically coupled to a supply voltage and another one of the plurality of through silicon vias is electrically coupled to a ground potential.

4. The semiconductor device of claim 1, further comprising an interposer, wherein the plurality of semiconductor memory dies are disposed on the interposer, and the plurality of through silicon vias are electrically connected to bond pads of the interposer.

5. The semiconductor device of claim 1, wherein the interposer comprises:
   a connection structure comprising a connection dielectric layer, a first conductive plate positioned in the connection dielectric layer and electrically coupled to a supply voltage, a first bottom protection layer positioned below the first conductive plate, and a first top protection layer positioned on the first conductive plate; and
   a connection conductive layer positioned in the connection dielectric layer;
   wherein the first bottom protection layer and the first top protection layer are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

6. The semiconductor device of claim 5, further comprising a second conductive plate positioned in the connection dielectric layer and electrically coupled to a ground potential, a second bottom protection layer positioned below the second conductive plate, and a second top protection layer positioned on the second conductive plate, wherein the second bottom protection layer and the second top protection layer are formed of same materials as the first bottom protection layer.

7. The semiconductor device of claim 6, further comprising a first redistribution structure positioned below the connection structure, a second redistribution structure positioned on the connection structure, a first semiconductor die positioned below the first redistribution structure, and a second semiconductor die positioned on the second redistribution structure.

8. The semiconductor device of claim 7, wherein the first redistribution structure comprises a first redistribution dielectric layer positioned below the connection dielectric layer and a first redistribution conductive layer positioned in the first redistribution dielectric layer, the second redistribution structure comprises a second redistribution dielectric layer positioned on the connection dielectric layer and a second redistribution conductive layer positioned in the second redistribution dielectric layer, the first conductive plate is electrically coupled to the second redistribution conductive layer, the second conductive plate is electrically coupled to the first redistribution conductive layer, and the connection conductive layer is electrically coupled to the first redistribution conductive layer and the second redistribution conductive layer.

9. The semiconductor device of claim 6, further comprising a connection supporting layer positioned in the connection dielectric layer, wherein a thickness of the connection supporting layer is less than a thickness of the connection conductive layer.

10. The semiconductor device of claim 6, further comprising a barrier layer positioned on sides of the connection conductive layer and a bottom surface of the connection conductive layer, wherein the barrier layer is formed of titanium nitride, tantalum nitride, titanium, tantalum, or titanium tungsten.

11. The semiconductor device of claim 6, further comprising a alleviation layer positioned in the connection dielectric layer, wherein the alleviation layer is porous.

12. The semiconductor device of claim 6, further comprising a first magnetic layer positioned above the first top protection layer and a second magnetic layer positioned below the second bottom protection layer, wherein the first conductive plate is positioned above the second conductive plate and one of the first magnetic layer or the second magnetic layer is permanently magnetized.

13. The semiconductor device of claim 12, wherein a distance between the first magnetic layer and the first top protection layer is equal to a distance between the second bottom protection layer and the second magnetic layer.

14. The semiconductor device of claim 13, wherein a width of the first magnetic layer is greater than a width of the first top protection layer.

15. A method for fabricating a semiconductor device, comprising:

preparing a plurality of semiconductor memory dies with a plurality of via holes penetrating the semiconductor memory dies;
forming a plurality of protection liners on sides of the plurality of via holes;
forming a plurality of through silicon vias in the plurality of via holes, wherein the plurality of protection liners surrounds the plurality of through silicon vias; and
vertically stacking the plurality of semiconductor memory dies through a plurality of microbumps to form a memory stack, wherein the plurality of microbumps electrically connects the plurality of through silicon vias of two adjacent semiconductor memory dies;
wherein the plurality of protection liners are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

16. The method for fabricating the semiconductor device of claim 15, further comprising:
forming an interposer having a plurality of first bond pads on a first side and a plurality of second bond pads on a second side; and
attaching the memory stack to a first site of the interposer.

17. The method for fabricating the semiconductor device of claim 16, further comprising a step of attaching a processor die to a second site of the interposer, wherein the first site and the second site are on the first side of the interposer.

18. The method for fabricating the semiconductor device of claim 16, further comprising a step of attaching a package substrate on a second side of the interposer.

19. The method for fabricating the semiconductor device of claim 16, wherein the forming of the interposer comprises:
forming a connection structure comprising a connection dielectric layer, a first conductive plate in the connection dielectric layer and electrically coupled to a supply voltage, a first bottom protection layer below the first conductive plate, and a first top protection layer on the first conductive plate; and
forming a connection conductive layer in the connection dielectric layer;
wherein the first bottom protection layer and the first top protection layer are formed of manganese-zinc ferrite, nickel-zinc ferrite, cobalt ferrite, strontium ferrite, barium ferrite, lithium ferrite, lithium-zinc ferrite, single crystal yttrium iron garnet, or gallium substituted single crystal yttrium iron garnet.

20. The method for fabricating the semiconductor device of claim 19, wherein the forming of the interposer further comprises: forming a second conductive plate in the connection dielectric layer and electrically coupled to a ground potential, a second bottom protection layer below the second conductive plate, and a second top protection layer on the second conductive plate, wherein the second bottom protection layer and the second top protection layer are formed of same materials as the first bottom protection layer.

* * * * *